(12) United States Patent
Martin et al.

(10) Patent No.: US 7,906,826 B2
(45) Date of Patent: *Mar. 15, 2011

(54) MANY MILLION PIXEL IMAGE SENSOR

(75) Inventors: Peter Martin, Haiku, HI (US); Paul Johnson, El Cajon, CA (US); Chris Sexton, San Diego, CA (US)

(73) Assignee: e-Phocus, San Jose, CA (US)

( * ) Notice: Subject to any disclaimer, the term of this patent is extended or adjusted under 35 U.S.C. 154(b) by 41 days.

This patent is subject to a terminal disclaimer.

(21) Appl. No.: 11/904,782

(22) Filed: Sep. 28, 2007

(65) Prior Publication Data
US 2008/0128698 A1 Jun. 5, 2008

Related U.S. Application Data

(63) Continuation-in-part of application No. 11/361,426, filed on Feb. 24, 2006, now Pat. No. 7,276,749, and a continuation-in-part of application No. 10/785,833, filed on Feb. 23, 2004, now Pat. No. 7,436,038, which is a continuation of application No. 10/746,529, filed on Dec. 23, 2003, now abandoned, and a continuation of application No. 10/648,129, filed on Aug. 26, 2003, now Pat. No. 6,809,358, and a continuation of application No. 10/371,618, filed on Feb. 22, 2003, now Pat. No. 6,730,900, and a continuation of application No. 10/229,956, filed on Aug. 27, 2002, now Pat. No. 6,798,033, and a continuation of application No. 10/229,955, filed on Aug. 27, 2002, now Pat. No. 7,411,233, and a continuation of application No. 10/229,954, filed on Aug. 27, 2002, now Pat. No. 6,791,130, and a continuation of application No. 10/229,953, filed on Aug. 27, 2002, now abandoned, and a continuation of application No. 10/072,637, filed on Feb. 5, 2002, now Pat. No. 6,730,914.

(51) Int. Cl.
H01L 31/062 (2006.01)

(52) U.S. Cl. ........ 257/444; 257/291; 257/258; 257/222; 257/229; 257/E27.133; 257/292

(58) Field of Classification Search .................. 257/222, 257/229, 234, 258, 291, 292, E27.133, 444
See application file for complete search history.

(56) References Cited

U.S. PATENT DOCUMENTS 6,759,262 B2 * 7/2004 Theil et al. ............... 438/48
7,436,038 B2 * 10/2008 Engelmann et al. ......... 257/444

* cited by examiner

Primary Examiner — Tan N Tran
(74) Attorney, Agent, or Firm — John R. Ross

(57) ABSTRACT

A CMOS image sensor with a many million pixel count. Applicants have developed techniques for combining its continuous layer photodiode CMOS sensor technology with CMOS integrated circuit lithography stitching techniques to provide digital cameras with an almost unlimited number of pixels. A preferred CMOS stitching technique exploits the precise alignment accuracy of CMOS stepper processes by using specialized mask sets to repeatedly produce a single pixel array pattern many times on a single silicon wafer with no pixel array discontinuities. The single array patterns are stitched together lithographically to form a pixel array of many million pixels. A continuous multilayer photodiode layer is deposited over the top of the many million pixel array to provide a many million pixel sensor with a fill factor of 100 percent or substantially 100 percent.

9 Claims, 19 Drawing Sheets

| Parameter | Value | Unit | Comments |
|---|---|---|---|
| Array Size | 36 | MPix | Flexible stitching allows small and larger (up to 265 Mpixels) |
| Array min | 1.0 | MPix | Basic stepping block for array stitching |
| Fill Factor | 100 | % | Basic benefit of POAP |
| Pixel Size | 7.5 | micron | Future large devices can decrease to 6um pixels if needed |
| Full Well | 100 | Ke- | Future upgrades will allow a three fold increase |
| Nread | < 55 | rms e- | At room temperature |
| Pixel DR | > 10 | Bits | Pixel full well allows 65+ dB |
| ADC | 10 | Bits | |
| Pixel Clock | 50 | MHz | Nominal pixel rate, can be pushed to 75MHz |
| Frame Rate | 16 | fps | Nominal at 50 MHz pixel clock, 24 fps at 75 MHz |
| Linearity | >95 | % | |
| FPN | <5 | % | Easily corrected by off chip processing |
| Gain Uniformity | >90 | % | Easily corrected by off chip processing |

FIG. 12

| Item | Specification |
|---|---|
| Pixel count | 6144 x 6144 |
| Master clock frequency | 10 MHz |
| Master clock period | 100 nanoseconds |
| ADC depth | 10-bit |
| FPA output | Twelve 10-bit parallel digital |
| ADC conversion | Two pixel rows at a time (3072 dual rows) |
| Sample and clamp time | 6.40 microseconds (64 clock cycles) |
| ADC conversion time | 102.4 microseconds (1024 clock cycles) |
| Total pixel row time | 108.8 microseconds (1088 clock cycles) |
| FPA frame time | 0.3342 seconds (3,342,336 clock cycles) |
| FPA frame rate | 3.0 frames per second |

FIG. 13

- Chip size is 52.14mm x 52.14mm.
- There are 1164 pads around perifery of chip. Pads are numbered counter-clockwise from pad 1.

MANY MILLION PIXEL IMAGE SENSOR

This application is a continuation in part of U.S. patent application Ser. No. 11/361,426 filed Feb. 24, 2006 now U.S. Pat. No. 7,276,749, and Ser. No. 10/185,833 filed Feb. 23, 2004 now U.S. Pat. No. 7,436,038, which was a continuation of patent application Ser. Nos. 10/746,529, filed Dec. 23, 2003 now abandoned; Ser. No. 10/648,129 filed Aug. 26, 2003, now U.S. Pat. No. 6,809,358; Ser. No. 10/371,618, filed Feb. 22, 2003, now U.S. Pat. No. 6,730,900; Ser. No. 10/229,953 filed Aug. 27, 2002 now abandoned; Ser. No. 10/229,954 filed Aug. 27, 2002, now U.S. Pat. No. 6,791,130; Ser. No. 10/229,955 filed Aug. 27, 2002 now U.S. Pat. No. 7,411,233; Ser. No. 10/229,956 filed Aug. 27, 2002, now U.S. Pat. No. 6,798,033 and Ser. No. 10/072,637 filed Feb. 5, 2002, now U.S. Pat. No. 6,730,914, all of which are incorporated herein by reference.

The present invention was made in the course of work under Contract Number NRO000-04-C-0110 with an agency of the United States Government and, the United States Government has rights in the invention.

This patent application relates to electronic image sensors and in particular to many million pixel electronic image sensors.

BACKGROUND OF THE INVENTION

The prior art includes a variety of image sensors. Image sensors operating in the visible and near infrared spectrums have widespread utility for military and commercial applications.

Charge Coupled Devices

Charge coupled device (CCD) image sensors are pixelated readout arrays fabricated on and in a crystalline silicon substrate. These sensors convert incident light to electric charges that are collected in pixels formed in the substrate. Pixelated charge packets are typically transferred to the periphery of the array by a "bucket brigade" technique and are converted to voltage signals by charge sensitive amplifiers located at the periphery of the array. These voltage signals are digitized by an off-chip analog-to-digital converter. The photoresponse of these sensors is typically limited to the 400 nm-900 nm spectral range by the semiconductor bandgap properties of crystalline silicon.

CMOS Image Sensors

Complementary metal-oxide semiconductor (CMOS) sensors are produced using standard CMOS fabrication processes typically utilized for the fabrication of integrated circuits. CMOS sensors convert incident light to electric charge in electronic circuitry fabricated in or on the silicon substrate. The electric charge is electrically measured using multiple-transistors pixel circuitry and readout electronics also fabricated on the silicon substrate. The CMOS sensor photo-response typically is also limited to the 400 nm-900 nm spectral range by the semiconductor bandgap properties of silicon. Also, in prior art CMOS sensors, the CMOS pixel circuitry obscures a major portion of each pixel's photosensitive area, resulting in low collection efficiency.

U.S. Pat. Nos. 5,528,043; 5,886,353; 5,998,794 and 6,163,030 are special examples of prior art patents utilizing CMOS circuits for imaging. These patents describe CMOS sensor technology developed by Applicants and their fellow workers in which a photodiode layer structure is produced in continuous layers on top of active CMOS pixels. U.S. Pat. No. 5,528,043 describes an X-ray detector utilizing a CMOS sensor array with readout circuits on a single chip. In that example image processing is handled by a separate processor. U.S. Pat. No. 5,886,353 describes a generic pixel architecture using a hydrogenated amorphous silicon layer structure in conjunction with CMOS circuits to form the pixel arrays. U.S. Pat. Nos. 5,998,794 and 6,163,030 describe various ways of making electrical contact to the underlying CMOS circuits in a pixel. All of the above US patents are incorporated herein by reference.

Pixel Count of Prior Art Commercial Digital Cameras

One of the main ways that camera manufacturers categorize their digital cameras is in terms of pixel count. Today this number varies between 1 million to around 14 million pixels. Currently most popular consumer digital cameras have between 2 and 7 million pixels. A 3 mega pixel camera can make excellent 4-inch×6-inch prints and very good 5-inch× 7-inch prints. For 8-inch×10-inch prints, then a 4 mega pixel or 5 mega pixel camera would be a better choice. Sometimes two numbers are given, total pixels and effective pixels. Total pixels count every pixel on the sensor surface. Usually the very edge pixels are not used in the final image. Effective pixels are the number of pixels actually used in the image after the edge pixels have been dropped. Efforts are being made to create techniques for greatly increasing the number pixels in digital images.

A Need for Large Pixel Count Sensors

Telescopes and microscopes are typically designed to image very small angular fields of view in order to provide good resolution of target regions. However images can be recorded with digital image sensors at relatively wide fields of view which can later be easily manipulated with computer processors on monitors to expand the images to produce almost unlimited magnification. But at some point depending on the number of pixels on which the target region has been imaged, the pixels begin to appear as squares or rectangles limiting the degree to which the image can be reasonably magnified.

Giga-Pixel Images

On Nov. 1, 2003 photographer Max Lyons posted on the Internet a 1.09 billion pixel image (40,748×26,800 pixels) of the view of Brice Canyon from Brice Point in Utah. He made the image by stitching 196 separate photographs taken with a 6 mega-pixel digital camera. It took 13 minutes to capture the 196 images, four days to stitch the images and three days to blend the seams.

Large Pixel Sensors Using Linear Array Detectors

A known technique for producing large pixel digital images is to scan a linear array detector (such as a 1024 14-micron pixel linear array) across a target region with a 0.1-micron precision scanner, collect scanned images and stitch the scanned images together with a computer processor. Such sensors are described in U.S. Pat. No. 6,917,696 (incorporated herein by reference). According to disclosures in the patent, images (such as microscope slide images) can be created with pixel counts such as 36,000×18,000 pixels (648 million pixels). Once the images are obtained in digital form, the images can be stored digitally or transmitted digitally through the Internet or similar communication systems. Software is described for examining the images at various effective magnifications merely by selecting small portions of the image and expanding those small portions on computer monitors as desired. The assignee of the patent claims that a 15 mm×15 mm target area can be scanned in less than 4 minutes to produce images with resolutions of 0.5 microns/pixel (equivalent to about 20× magnification).

Tiling Images to Increase Pixel Count

Techniques are available for producing large pixel count images by combining multiple digital images in a process called "tiling". An example is described in U.S. Pat. No. 6,272,235 (incorporated herein by reference) where multiple images obtained with a 752 pixel×480 pixel (360,960 pixels) CCD camera are combined to produce very high pixel count images that can be stored digitally and transmitted over the Internet. In an embodiment described in the patent, 80 images are obtained of a 4.8 mm×3.5 mm target region of a microscope slide at 1.25× magnification using special 0.1 micron precision scanning equipment and these 80 images are stitched together with special computer software to produce an image of the entire 4.8 mm×3.5 mm target region. Then additional tiled images are obtained of interesting portions of the entire target region at higher magnifications such as 4×, 20× and/or 40×. Red, green and blue color filters are provided to filter an illumination light source so that color images may be obtained. In the described preferred embodiment the 0.1 micron precision alignment of microscope slides avoids the necessity of complicated computer software (available in the prior art) for stitching the separate images together. Operators imaging the target can increase the magnification in steps as the images are obtained and in each step select smaller target regions for imaging. Doing so will generally greatly reduce the number of images needed to obtain enough images at desired magnification to fully evaluate the sample under investigation. But selection of the smaller regions to be successively imaged requires very experienced personnel able to recognize significant features in the lower magnification images. For example, 80 images could be obtained at each of 1.25×, 4×, 20× and 40×; in this case the size of the image areas would be progressively smaller. But the pixel resolution improves from about 6.4 microns at 1.25× to 0.2 microns at 40×. In this example only 320 images would be required. Imaging the entire 4.8 mm×3.5 mm target area at 0.2 microns per pixel with the 752 pixel×480 pixel CCD camera would require about 1,163 images. If the 4.8 mm×3.5 mm target were imaged at 1 micron per pixel with the 752 pixel×480 pixel CCD camera about 47 images would be required. The reader should note that target regions of microscope slides could be much larger than 4.8 mm×3.5 mm. Some are as large as about 25 mm×25 mm. Imaging a region this large at 0.2 microns with a 752 pixel×480 pixel camera would require about 43,160 images.

Stitching to Produce Large Integrated Circuits

Reticles used in integrated circuit lithographic processes are typically limited in size to about 22 mm×22 mm. This places a limit on the size of integrated circuits that can be fabricated with a single reticle set. However, integrated circuit fabricators have developed stitching techniques to permit stitching of integrated circuits with very high precision such as in the range of fractions of a micron.

Stitching to Produce Large Pixel Count Sensors

The 22 mm×22 mm reticle size limit also places a limit on the number of pixels that can be fabricated with a single mask set. But the prior art includes efforts to fabricate larger pixel count sensors by fabricating separate circuits on a single silicon wafer and then stitching them together. One such sensor is described in U.S. Pat. No. 6,690,076. This sensor utilizes a pixel design with pixel circuitry occupying a portion of the surface defining the pixel array area so that only a portion of the surface area is covered by photo diode material. (The portion of the pixel array area that is available for collecting light is called the "fill factor".) In the sensor described in that patent there are areas near the stitching boundaries where there is no pixel coverage. In these areas other circuits are incorporated within the large pixel array. In this sensor the portion of the pixel array available for collecting light is substantially less than 100 percent so its fill factor is substantially less than 100 percent.

Improving Fill Factors

A known technique for improving the fill factor with sensors having a pixel array area with substantially less than 100 percent photo diode coverage is to cover the pixel array area with micro-lenses designed to focus light onto the photo diode regions. However, these micro-lenses tend to produce distortion in portions of the field of view that is at significant angles with the normal to the sensor.

There is a need for digital sensors with substantially 100 percent photo diode coverage (100 percent or substantially 100 percent fill factor) and an extremely large number of pixels to produce images quickly with no post imaging stitching or tiling or with very minimal post imaging stitching or tiling.

SUMMARY OF THE INVENTION

Many Million Pixels Sensor

The present invention provides a CMOS image sensor with a many million pixel count. Applicants have developed techniques for combining its continuous layer photodiode CMOS sensor technology with CMOS integrated circuit lithography stitching techniques to provide digital cameras with an almost unlimited number of pixels. A preferred CMOS stitching technique exploits the precise alignment accuracy of CMOS stepper processes by using specialized mask sets to repeatedly produce a single pixel array pattern many times on a single silicon wafer with no pixel array discontinuities. The single array patterns are stitched together lithographically to form a pixel array of many million pixels. A continuous multilayer photodiode layer is deposited over the top of the many million pixel array to provide a many million pixel sensor with a fill factor of 100 percent or substantially 100 percent.

In preferred embodiments built and tested by Applicants thirty six 1,048,576-pixel blocks were stitched together lithographically to produce sensors element with pixel counts of somewhat more than 36 million pixels (the actual pixel count is 37,748,736 pixels) with no discontinuities. In this application Applicants generally refer to this sensor as their 36 million pixel sensor. In the lithographic process, five 36 million-plus pixel sensor elements were lithographically fabricated on single 8-inch wafers along with a number of smaller sensors fitted around the larger sensors. Pixel sizes in this preferred embodiment are 7.5-micron×7.5-micron. One of these 36-million pixel sensor when assembled as an optical instrument permits Applicants to obtain a microscopic image a 6-mm×6-mm target image area with about 1 micron resolution and a telescopic image of a 6-kilometer×6-kilometer target image area with about 1.0 meter resolution or a 1-kilometer×1 kilometer target area with about 16 cm (6-inch) resolution. The described techniques can be easily extrapolated to provide a 250 million pixel sensor on a standard 8-inch wafer to provide much better resolution or image a much larger target areas with a single image. Further extrapolation by increasing the wafer size or reducing the pixel size can produce sensors with pixel counts of one billion pixels or more!

Stitching without Discontinuities

A preferred embodiment is a 36 million pixel CMOS sensor. The preferred embodiment utilizes a special lithographic stitching technique which includes the use of a 16 piece reticle set with each reticle in the set having on it, 9 masks for a total of 144 masks. The masks on a single reticle are used to lay down a single layer in the lithography process for fabricating the integrated circuits of the preferred sensor. In the lithography process, spatial filters are used to block all but one mask at a time. (The terms "reticle" and "mask" are sometime used interchangeably. In this application, Applicants use the term "reticle" to refer to a lithography component one or more separate masks [such as 9 or 15 separate masks]. The term "mask" will be used to refer to the individual masks.)

Sixteen of the masks (one located on each reticle) constitute a set of 16 pixel array masks. The 16 pixel array masks are needed for fabricating one 1,048,736 pixel array. Each of these 16 pixel array masks are utilized 36 times to lay down 36 contiguous 1,048,736 sub-array to produce the 37,748,736 pixels in the pixel array for this preferred embodiment. The sub-arrays are positioned with sub-micron accuracy so that pixel spacings between border pixels of two adjacent arrays are the same as spacings between pixels within the sub-arrays.

Sixteen sets of two masks were used six times each to produce the left and right side row readout circuits and sixteen sets of two masks were used six times each to produce the top and bottom clamp and hold and A/D column circuits. Sixteen sets of four corner circuit masks were used once to produce the bias and buffer circuits for the sensor.

Each pixel circuit comprises a charge collecting electrode and three transistors (i.e. a reset transistor, a source follower transistor and a readout transistor switch). A single continuous multi-layer photodiode layer of charge generating material is located above the pixel circuits to convert electromagnetic radiation into electrical charges.

The sensor array also includes and a surface electrode located above the photodiode layer which in the preferred embodiment is held at a positive potential of between about 3 to 5 volts (such as 3.5 volts) relative to a ground potential. At reset, the pixel circuit is reset at a positive reset potential close to the ground potential and about 2.5 volts relative to the surface electrode. Light from a target region is focused on the sensor. Charges, collected on the pixel electrode during signal integration (or drained from the electrode), charge (or discharge) the pixel in proportion to light intensity in the photodiode region above the pixel circuit. The extent of the increase (or decrease) in charge at each pixel provides a raw pixel signal. A clamp potential determined by a calibration procedure is electrically subtracted from each raw pixel signal to produce a corrected pixel signal representing the pixel illumination. The corrected pixel signals are digitized on the chip and digitized signals are readout to a processor and converted to images.

For this preferred embodiment Applicants used a previously tested and verified lithography mask design for a 1,048,736 pixel sensor. By separating the mask for the sensor into nine sections (including a single pixel array and various biasing readout and other circuitry) on the major masks and using the stitching technique referred to above, Applicants are able to fabricate sensors with almost unlimited pixel count (limited now only by the size of silicon wafers). Applicants describe below the previously tested and verified 1,048,736 pixel sensor and the 37,748,736 pixel sentry. The pixel array of the 1,048,736 pixel sensor is basically repeated 36 times in the 37,748,736 pixel sensor and the readout, biasing and other circuitry of the 37,748,736 pixel sensor is basically the same as the corresponding circuitry in the smaller 1,048,737 sensor except these circuits are programmed to handle much more data.

Almost Unlimited Pixel Count

In one of the parent patent applications (Ser. No. 11/361,426) Applicants describe 250 million pixel sensor that can be fabricated on an 8-inch wafer without reducing the pixel size below 7.5 microns. Some of that description is repeated here. (Applicants have other sensors currently in prototype production that are designed with 3-micron×3-micron pixels. Other sensor fabricators have produced sensors with pixels as small as 1.75 microns and may be as small as 1 micron.) Reducing the pixel size in the stitched sensor to 3 microns or smaller could result in an extremely large pixel count on a sensor that could be fabricated on an 8-inch wafer. As stated above further increases in pixel count could be achieved by using larger wafers. If needed sensors with more than a billion pixels could be produced using the concepts of the present invention.

Continuous Photodiode Layer

In preferred embodiments the photodiode layer is a single three-layer photodiode layer of charge generating material located above the pixel circuits convert electromagnetic radiation into electrical charges. This photodiode layer comprises an n-layer, and i-layer and a p-layer. The photodiode layer is laid over the top of the pixel circuitry. By laying the photodiode structure over the pixel readout circuitry, the resulting sensor has a near-unity (substantially 100 percent) fill factor. This feature results in near unity quantum efficiency for specific wavelength bands. This provides a distinct advantage over a front-illuminated charge-coupled device or conventional CMOS imagers, both which effectively shield a large portion of the pixel's active photo-converter area with surface readout circuitry. Applicants' continuous photodiode layer laid over their pixel array together with its use of the stitching technique that provides a stitch width no larger than the spaces between each of the pixel circuits means that the combined pixel array is completely continuous without any discontinuities between the stitched pixel arrays.

Applicants' continuous photo diode layer laid over the pixel array permits Applicants to fabricate of extremely tiny pixels; however smaller pixel size in general increases defects, so Applicants' current preferred pixel size is 7.5 microns permitting reasonable chip yields with this huge number of circuits.

Broad Spectral Response

In preferred embodiments microcrystalline germanium is utilized in the photodiode layer in order to increase the spectral range of the sensors. In a preferred design a hybrid i-layer is provided with a microcrystalline germanium layer sandwiched between two amorphous silicon sub-layers and thin microcrystalline silicon layers are used at the boundaries between the microcrystalline germanium and the amorphous silicon to provide band-gap graded boundaries to improve electron flow through the hybrid i-layer.

BRIEF DESCRIPTION OF THE DRAWINGS

FIG. 12 shows some top level specifications for the 36 million pixel sensor.

FIG. 13 shows some timing specifications for the sensor.

DETAILED DESCRIPTION OF PREFERRED EMBODIMENTS

Many Million Pixel Sensors

The present invention provides CMOS sensors having a single continuous photodiode layer covering a pixel circuit array with at least about 25 million pixels. In preferred embodiments pixel sizes range from about 1.75 microns to 7.5 microns. Current standard pixel sizes are 1.75 microns, 3 microns, 5 microns and 7.5 microns. Applicants have fabricated and tested a sensor with 36 million 7.5 micron pixels and have described detailed designs for a much larger pixel with pixel counts as high as 250 million pixels or greater.

CMOS Lithographic Stitching for Very Large Pixel Arrays

In the parent patent applications listed in the first sentence of this application, Applicants and their fellow workers describe in detail Applicant's proprietary process of fabricating CMOS sensors by depositing a single continuous multi-layer photodiode layer on top of an array of pixel circuits to provide substantially 100 percent packing factor and minimize pixel sizes. Applicants have developed techniques for combining its continuous layer photodiode CMOS sensor technology with CMOS integrated circuit lithography stitching techniques to provide digital cameras with an almost unlimited number of pixels. These techniques are described below:

100 Million and 250 Million Pixel Sensor Designs

CMOS Stitched Sensor Fabrication

Figure 1:
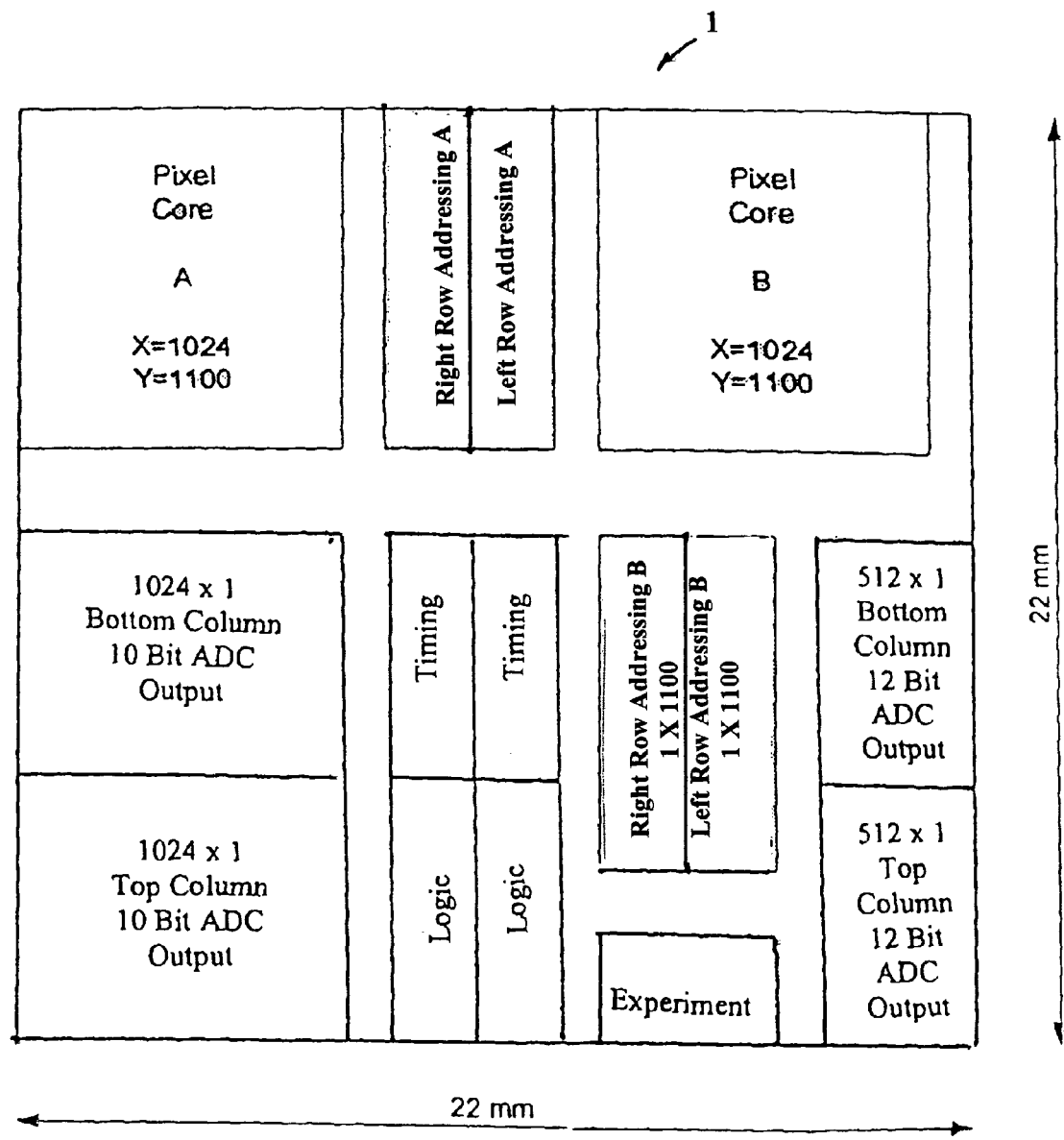
FIG. 1 shows a mask set for fabricating a 100 million pixel sensor.

CMOS stitching techniques are specialized CMOS foundry techniques that permit large (such as wafer scale) electrical circuits to be fabricated. FIGS. 1, 2, 3 and 4 refer to a mask set discussed in parent application Ser. No. 11/361,426 referred to above. A conventional CMOS process (the 0.35 micron process, for example) stitches together many identical and/or different electrical circuits, each equal to or smaller than the conventional 22 mm×22 mm photolithography mask size, by using a precise stepper photolithography device to sequentially expose particular layers of each circuit in many precise circuit locations on the eight inch wafer. The stepper devices are capable of sub-micron revisit alignment accuracy, so different layers (for example, 18 layers) of the identical circuits are fabricated by exposing wafer regions through different photolithography sub-masks (such as eighteen sub-masks per circuit), and then subjecting the wafers to conventional CMOS fabrication techniques. The CMOS stitching technique exploits the precise alignment accuracy of the CMOS stepper process by using a specialized mask set, such as the one displayed at 1 in FIG. 1. FIG. 1 contains the different redundant building blocks of a very large electrical circuit. The design of this prototype mask set is actually a design library featuring two separate pixel block designs (1) a baseline design (A) and an advanced pixel design (B), and their complementary 10-bit and 12-bit post processing circuitries; these circuit blocks feature programmable gain, correlated double sampling, and analog-to-digital converters (slope converters) at the end of each column of the pixel array. The pixel blocks each comprise a 1024 (H)×1100 (V) pixel array and the post processing blocks each comprise a linear array of redundant post processing circuits, 1024 elements for the 10-bit design and 512 elements for the 12-bit design. The row selection function is controlled by the row addressing blocks and the timing and logic functions are controlled by the timing/logic blocks.

Figure 2:
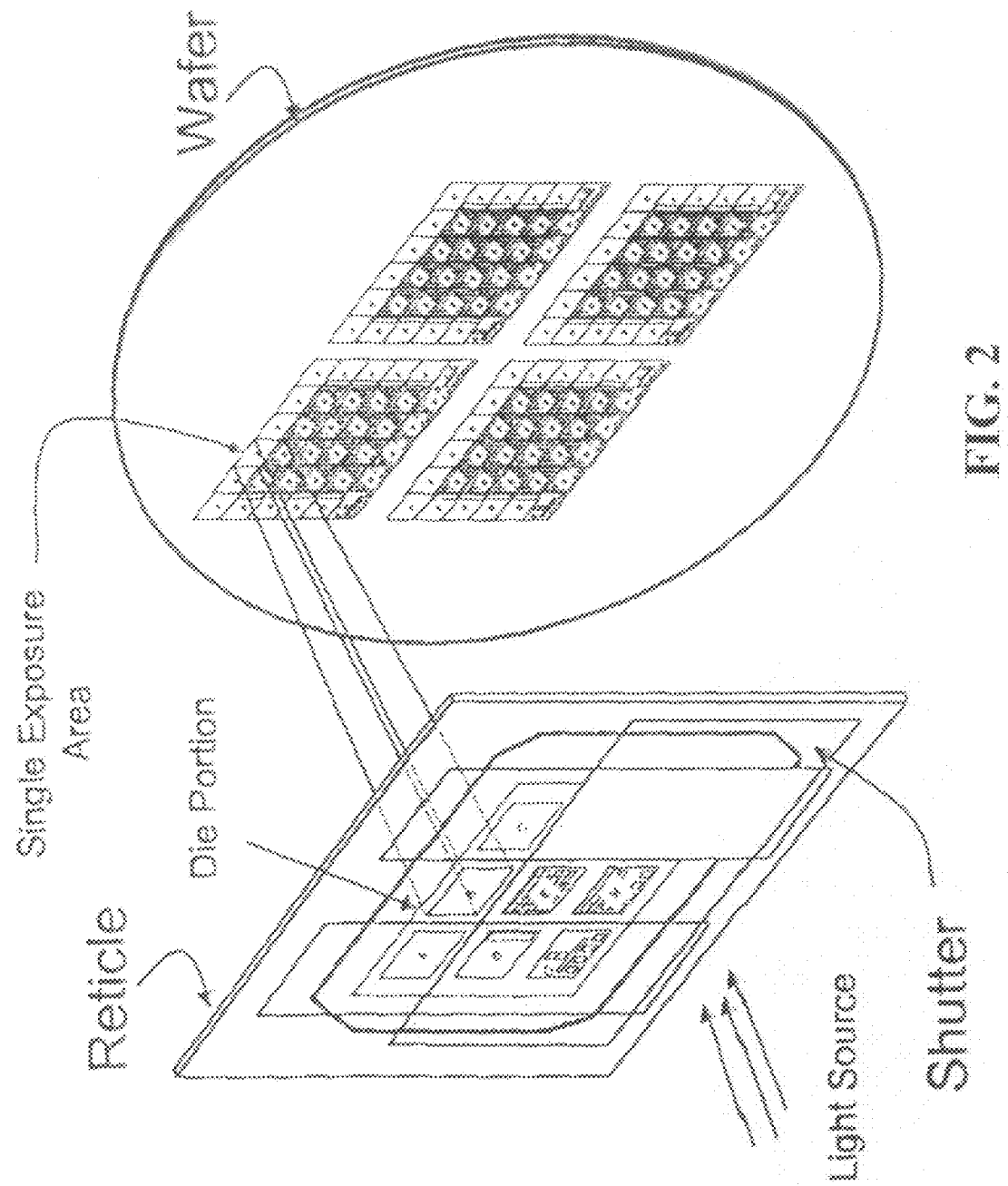
FIG. 2 shows a technique for covering all masks in the mask set except one mask being used.

The CMOS stitching mask set is fabricated and then utilized with a conventional CMOS 0.35 micron photolithography stepper system (0.1 micron alignment accuracy across entire wafer). The different blocks of each mask design are shuttered as shown in FIG. 2 so that only a single block is projected on the wafer at one time. Multiple sequential projections of different blocks, displayed in FIG. 2, result in the fabrication of very large electrical circuits, up the size of the entire wafer. It should be noted that stitching creates a truly seamless circuit, as opposed to assembly of closely butted individual circuits. The underlying discrete transistors are fabricated using the initial masks and ion implantation techniques. The overlying polysilicon and metal electrical lines are then fabricated to be electrically contiguous over a very large electrical circuit.

Figure 3:
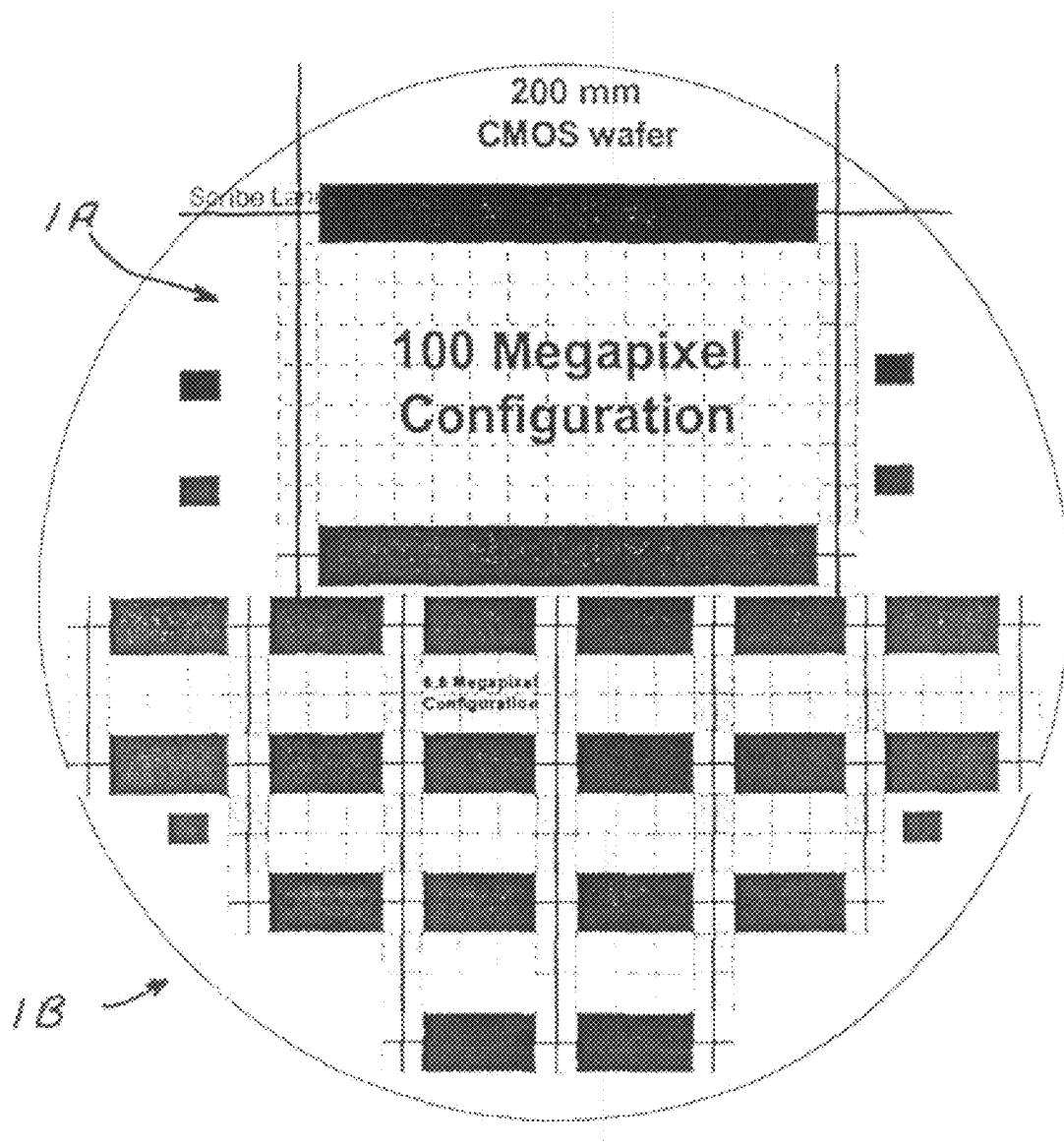
FIG. 3 shows a preferred arrangement for producing one 100 million pixel sensor and twelve smaller sensors on a single silicon wafer.

A preferred wafer layout for Applicants' development effort, displayed in FIG. 3, features a 102,502,400 pixel focal plane array circuit 1A (13 blocks×7 blocks with 1,126,400 pixels per block), twelve 6 million pixel focal plane array circuits 1B (each with 3 thousand pixels×2 thousand pixels), and several small test circuits. The relative locations of the different electrical building blocks can be seen in FIG. 3. The nearly 100 million pixel FPA features the baseline 10-bit pixel circuit, and six of the 6 million pixel circuits feature the advanced 12-bit pixel circuit which are described below.

FIG. 3 shows an exciting advantage of CMOS stitched technique is the ability to produce scalable or reconfigurable arrays. A single mask set can be used to fabricate different format focal plane arrays, on the same, or different wafers. This mask design can potentially provide a 250 million pixel (16 thousand pixels×16 thousand pixels) focal plane arrays just by re-specifying the mask exposure sequence to the stepper device.

Figure 4:
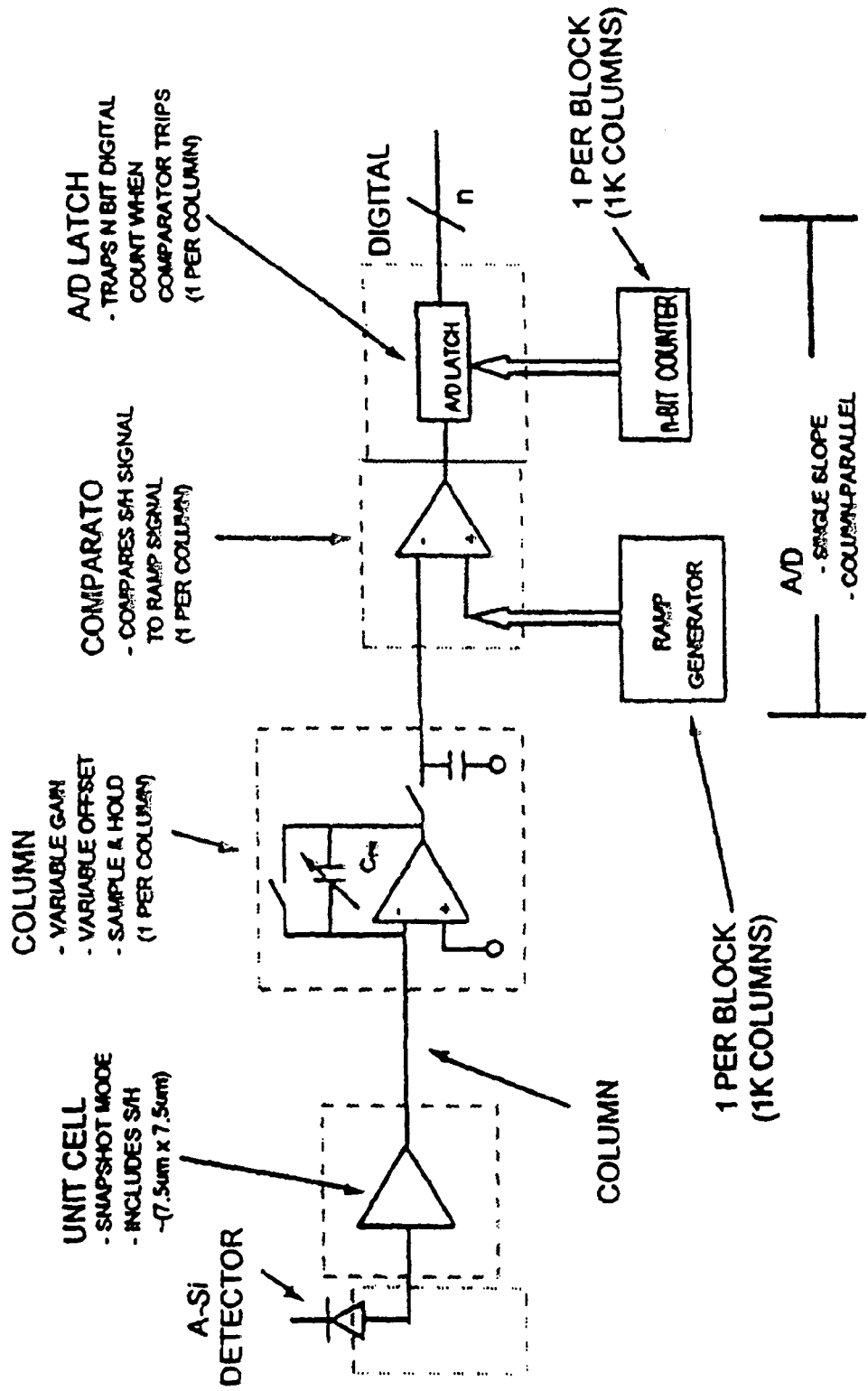
FIG. 4 shows some important features of the 100 million pixel sensor.
Figure 5:
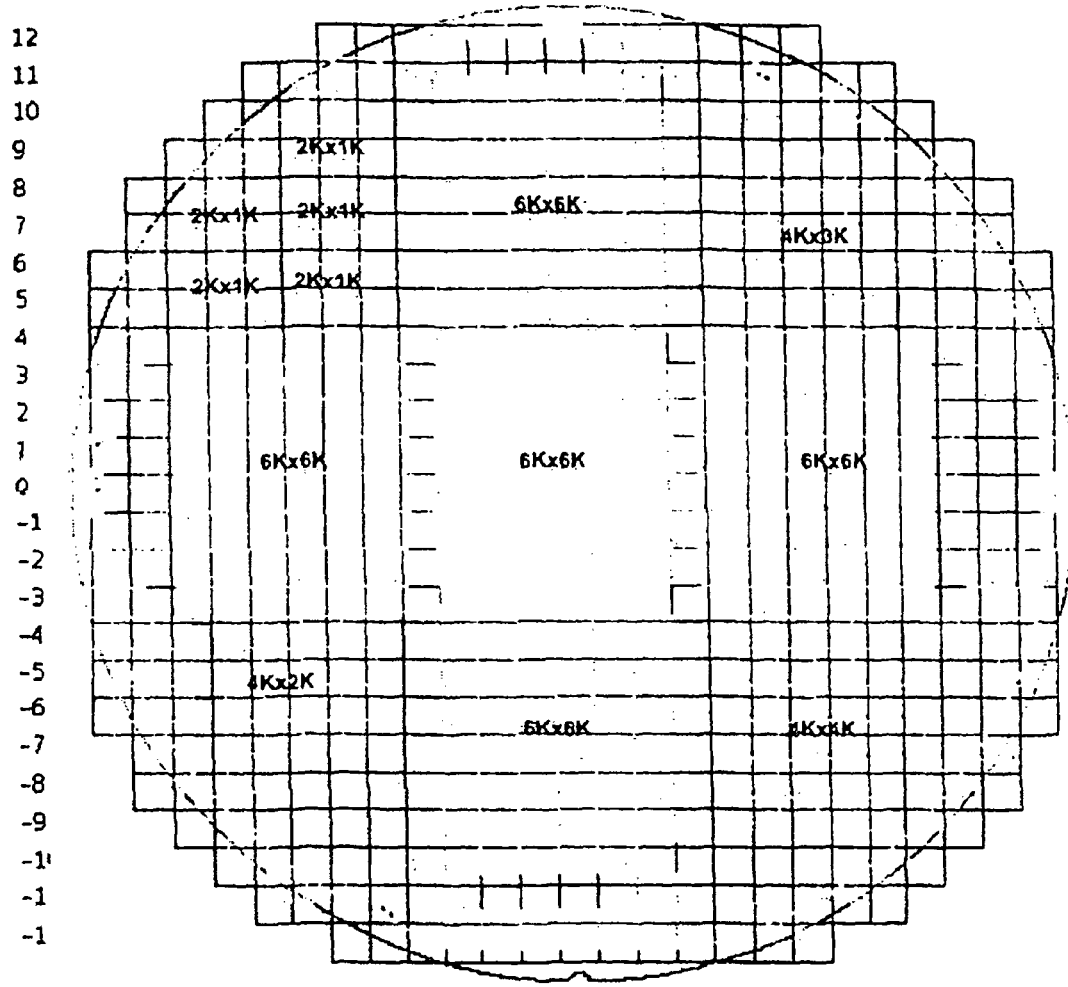
FIG. 5 shows a preferred arrangement for producing five 36 million pixel sensor and several smaller sensors on a single silicon wafer.

The overall electronic architecture of each FPA, displayed in FIG. 4, is an integrated CMOS architecture. The amplified output of the storage capacitor each pixel in a selected row is electrically connected to peripheral circuitry at the end of each column. The output voltage signal is amplified by a pre-selectable variable gain amplifier. Sample-and-hold circuitry is used to present the amplified signal to the analog-to-digital (A/D) converter. The A/D slope converter uses a linear ramp, derived from a 10-bit or 12-bit counter, as one input to a comparator. The sampled voltage is presented to the other input of the comparator. When the ramp voltage equals the sampled voltage, the comparator shuts off the counter. The count is the digitized voltage. A 1024-element (512-element) digital multiplexer then sequentially presents each column in a 1024-element (512-element) block to a 10-bit (or 12-bit) parallel digital output.

Thirty Six Million Pixel Prototype Sensor

In preferred embodiments actually built and tested by Applicants thirty six 1,048,576-pixel blocks were stitched together lithographically to produce sensor elements with pixel counts of somewhat more than 36 million pixels (the actual pixel count is 37,748,736 pixels) with no discontinuities. Features of this sensor are shown in FIGS. 5-16. (FIGS. 17 and 18 describe a special photodiode layer comprising microcrystalline germanium which can be used on the 36 million pixel array.) Five 36 million-plus pixel sensor elements were fabricated on single 8-inch wafers along with a number of smaller sensors fitted in around the larger sensors (see FIG. 5). Pixel sizes in this preferred embodiment are 7.5-micron×7.5-micron pixels. Each 36-million pixel sensor when assembled as an optical microscope permits Applicants to obtain a microscopic image a 6-mm×6-mm target image area with about 1 micron resolution. When assembled as a part of a telescope system, Applicants can obtain a telescopic image of 6-kilometer×6-kilometer target image area with about 1.0 meter resolution or a 1-kilometer×1 kilometer target area with about 16 cm (6-inch) resolution.

Stitching without Discontinuities

Figure 6:
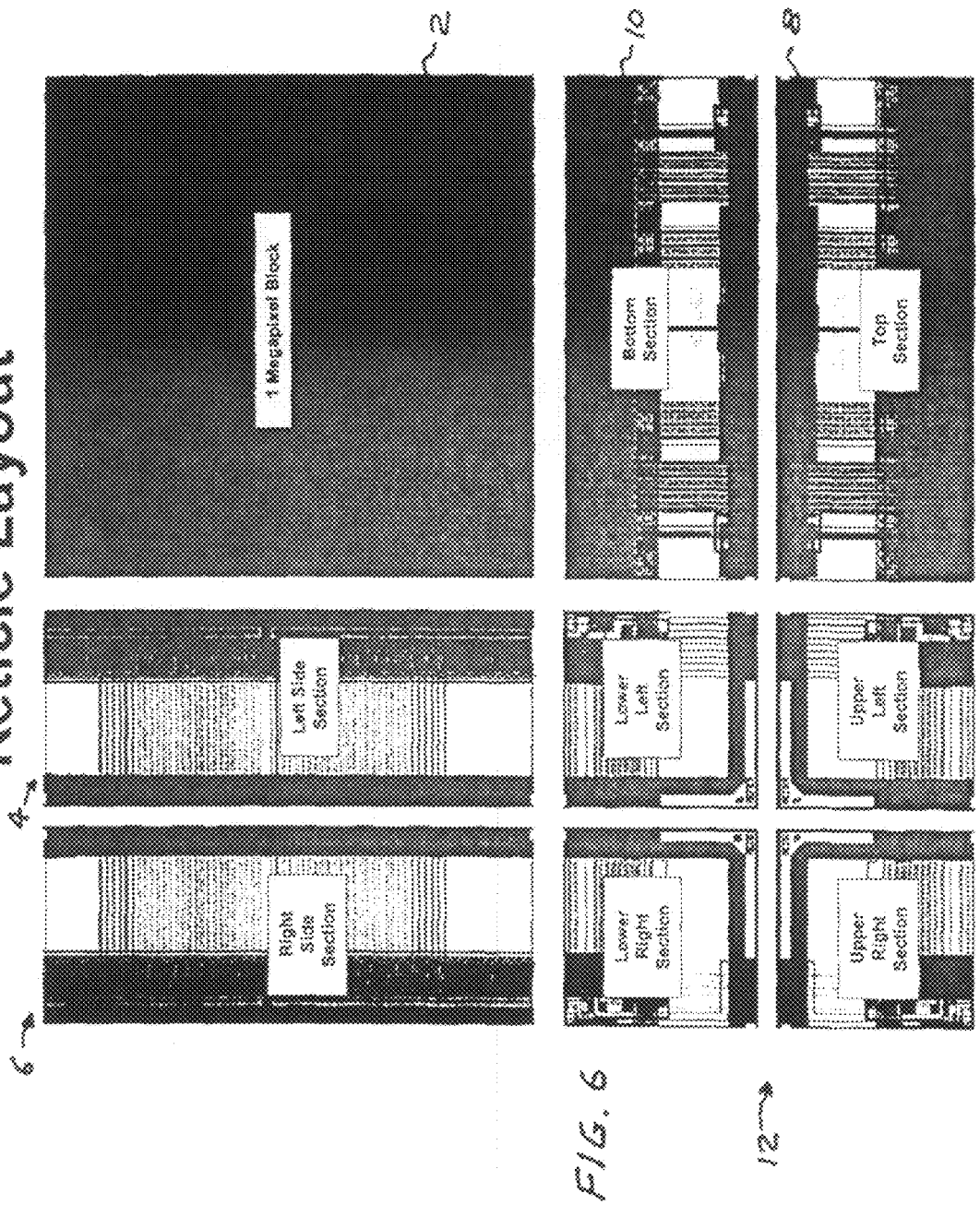
FIG. 6 shows a mask set Applicants used for fabrication a 36 million pixel sensor.
Figure 7:
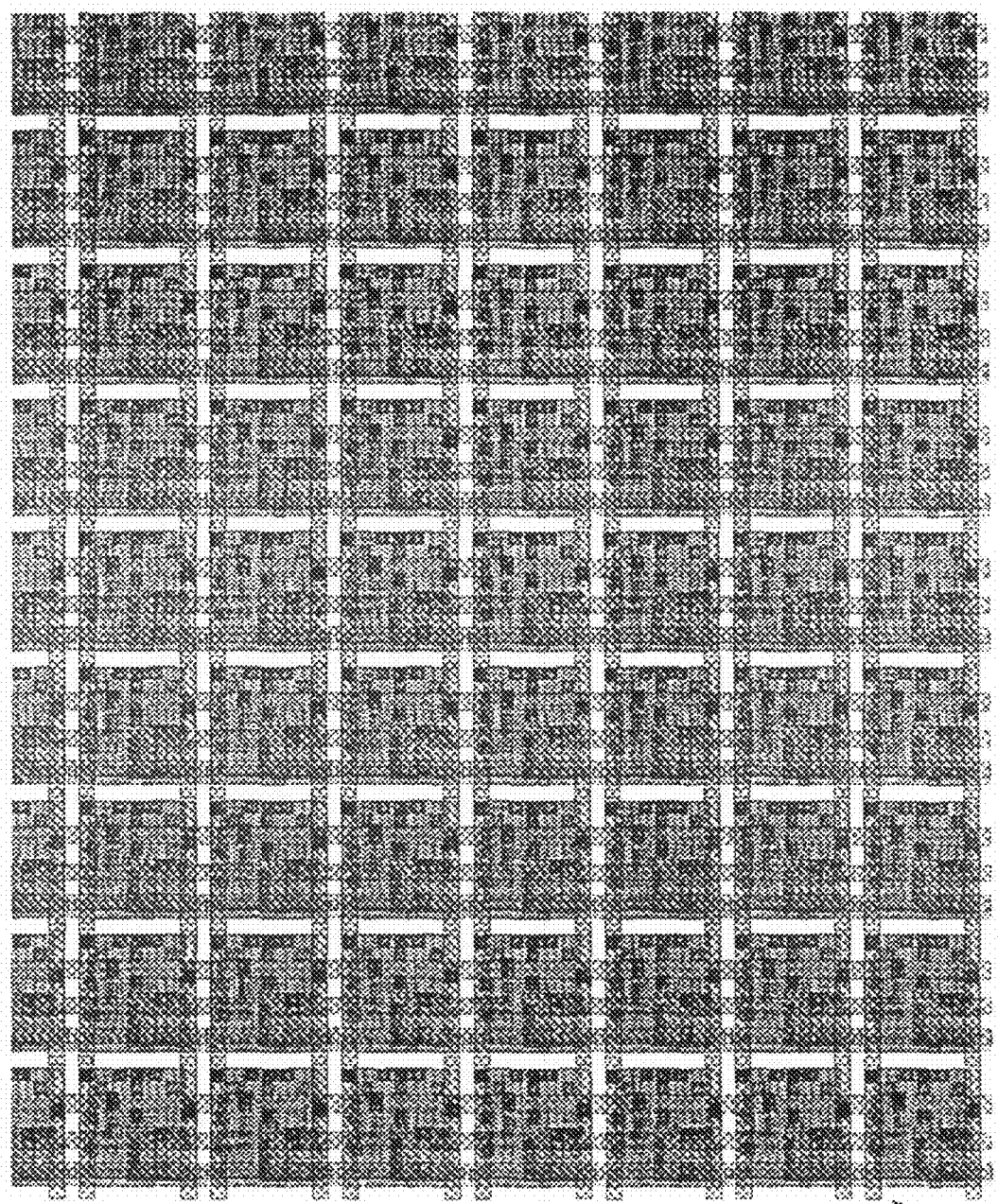
FIG. 7 shows a portion of the mask set illustrating how 1 million pixel arrays are stitched together to provide the 36 million pixel array with no discontinuities.

Special lithographic stitching techniques in a preferred embodiment include a sixteen piece reticle set with each reticle in the set having on it nine masks for a total of 144 masks. FIG. 6 is a computer developed drawing showing an overlay version of the nine sub-masks overlayed on top of each other. In the lithography process (as shown in FIG. 2), special filters are used to block all but one sub-mask at a time. One of the sub-masks in each set (as shown in FIG. 1B) constitute a pixel array mask set 2 in FIG. 6 for fabricating a 1,048,736 pixel array which was utilized 36 times for each layer of the sensor to produce the 37,748,736 pixels in the pixel array for this preferred embodiment. Two masks 4 and 6 were used six times each to produce the left and right side row readout circuits and two masks 8 and 10 were used six times each to produce the top and bottom clamp and hold and A/D column circuits. Four corner circuits masks 12 were used once to produce the bias and buffer circuits. FIG. 7 is a computer generated drawing showing a bottom left corner of one of the mask sets for the pixel array. Note that conductor lines at 14 extend about 0.5 microns beyond the pixel array and they overlap by about 0.2 microns so that the connecting lines between pixels at the boundaries between the 1 million pixel arrays are the same length as the connecting lines between the pixels within the 1 million pixel arrays. Therefore, when the 36 separate approximately 1 million pixel arrays are stitched together during the lithographic fabrication processes the result is a continuous seamless array of 36 (plus) million pixels without any discontinuities.

Figure 9:
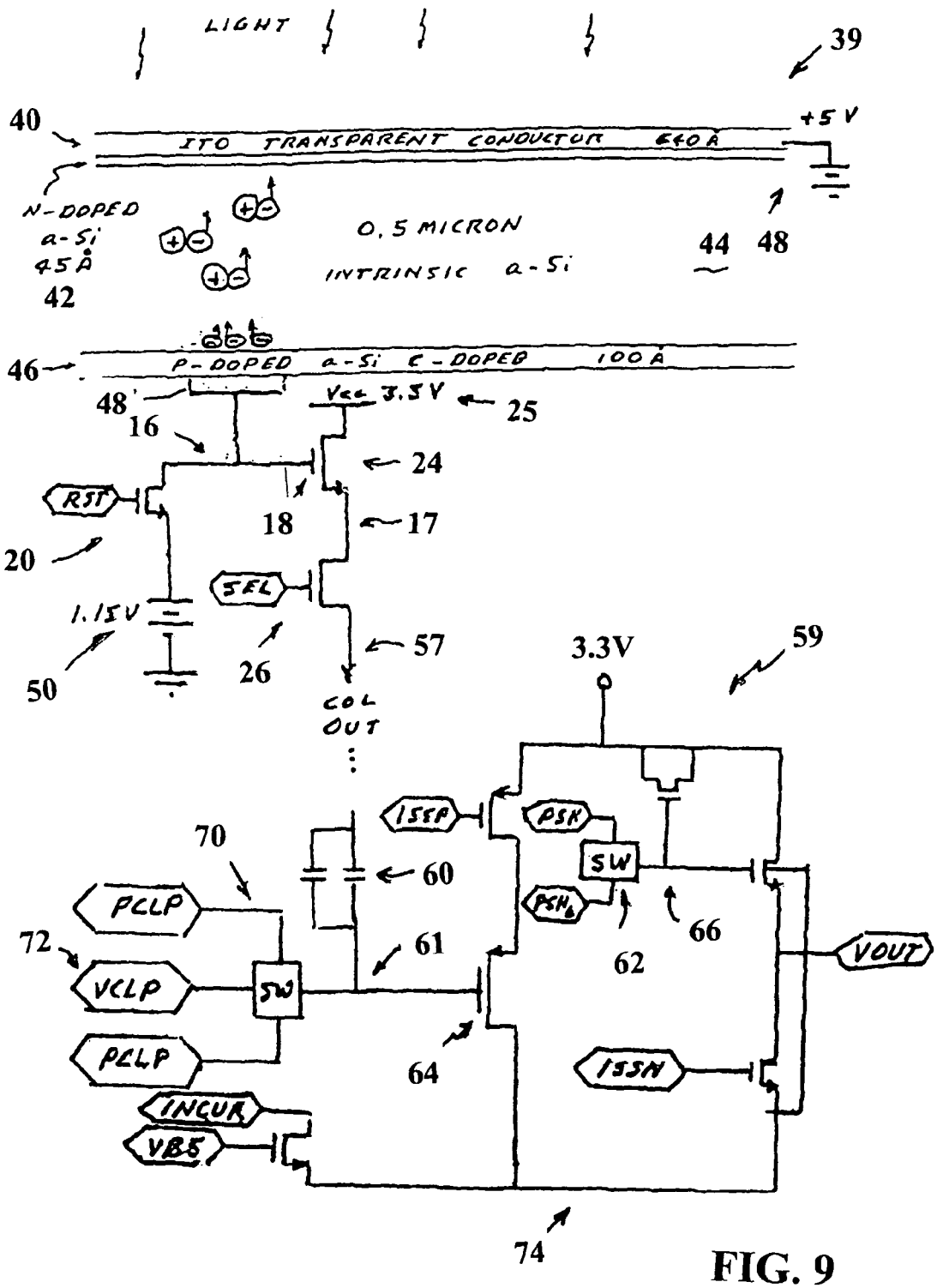
FIGS. 9 and 9A show elements of the pixel and readout circuits of the 36 million pixel sensor.
Figure 9A:
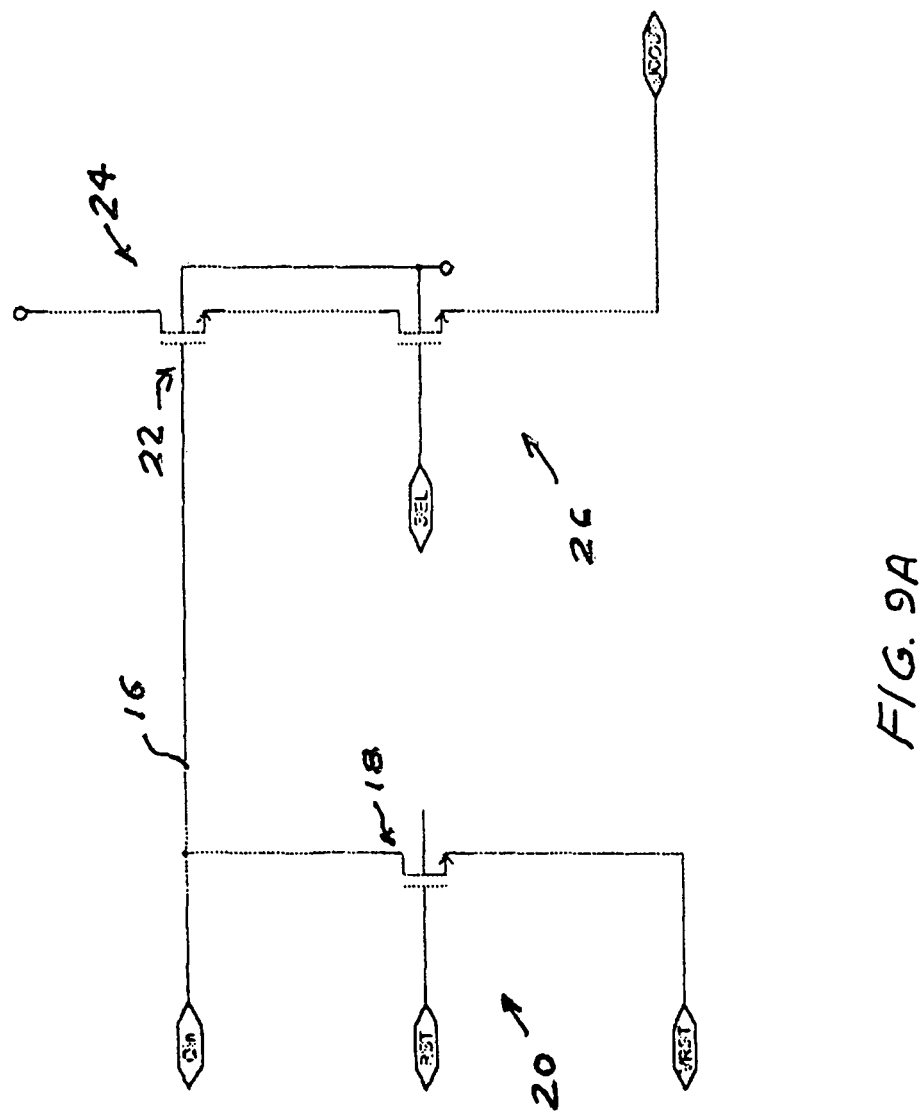

Each pixel circuit comprises a charge collecting electrode 48 and three transistors (a reset transistor 20, a source follower transistor 24 and a readout transistor switch 26 as shown in FIGS. 9 and 9A). A photodiode layer of charge generating material located above the pixel circuits convert electromagnetic radiation into electrical charges. This photodiode layer defines at least an n-layer 42, an i-layer 44 and a p-layer 46. The sensor array also includes and a surface electrode located above the photodiode layer which in the preferred embodiment is held at a positive potential of about 5 volts. At reset the pixel circuit is discharged to a potential of close to ground potential. Charges collected on the pixel electrode during signal integration increase the pixel potential in proportion to light intensity in the photodiode region above the pixel circuit. Light from a target region is focused on the sensor. The extent of the increase in potential at each pixel is the pixel signal. The pixel signals of all of the pixels represent an image of the target region.

Extrapolating the 36 Million Pixel Design

These techniques can be used to produce sensors with almost unlimited pixel count. More than 250 million pixel sensors can be fabricated on an 8-inch wafer without reducing the pixel size below 7.5 microns. (Applicants have other sensors currently in prototype production are designed with 3-micron×3-micron pixels. Other sensor fabricators have pixels as small as 1.75 microns and may be as small as 1 micron.) Reducing the pixel size in the stitched sensor to 3 microns or smaller could result in an extremely large pixel count on a sensor that could be fabricated on an 8-inch wafer. Further increases in pixel count could be achieved by using larger wafers. If needed sensors with more than a billion pixels could be produced using the concepts of the present invention and existing lithography techniques. On the other hand the designs can be extrapolated in the other direction. For example there could be advantages in having relatively large size pixels, much larger than 7.5 microns on a large substrate such as a full wafer substrate. In these cases the number of pixels could be substantially less than 36 million. For example, 20 million 30 micron×30 microns pixels could be fabricated on an 8 inch wafer using the concepts of the present invention. Larger pixels would typically have better signal to noise performance and fabrication yields would generally be much better.

Continuous Photodiode Layer

In preferred embodiments the photodiode layer is a single three-layer photodiode layer of charge generating material, located above the pixel circuits, that converts electromagnetic radiation into electrical charges. This photodiode layer comprises an n-layer, and i-layer and a p-layer. All of the pixel circuitry is located beneath the photodiode layer. Each pixel is defined by a pixel electrode. By coating the amorphous or microcrystalline photodiode structure over the pixel readout circuitry, the resulting sensor has a near-unity fill factor. This feature results in near unity quantum efficiency for a specific wavelength band. This provides a distinct advantage over a front-illuminated charge-coupled device or conventional CMOS imagers, both which effectively shield a large portion of the pixel's active photo-converter area with overlying readout circuitry. This permits Applicants to fabricate of extremely tiny pixels; however smaller pixel size makes in general increases defects, so Applicants' current preferred pixel size is 7.5 microns×7.5 microns. The pixel electrodes are about 6.1 microns×5.5 microns.

Electronics

Figure 8:
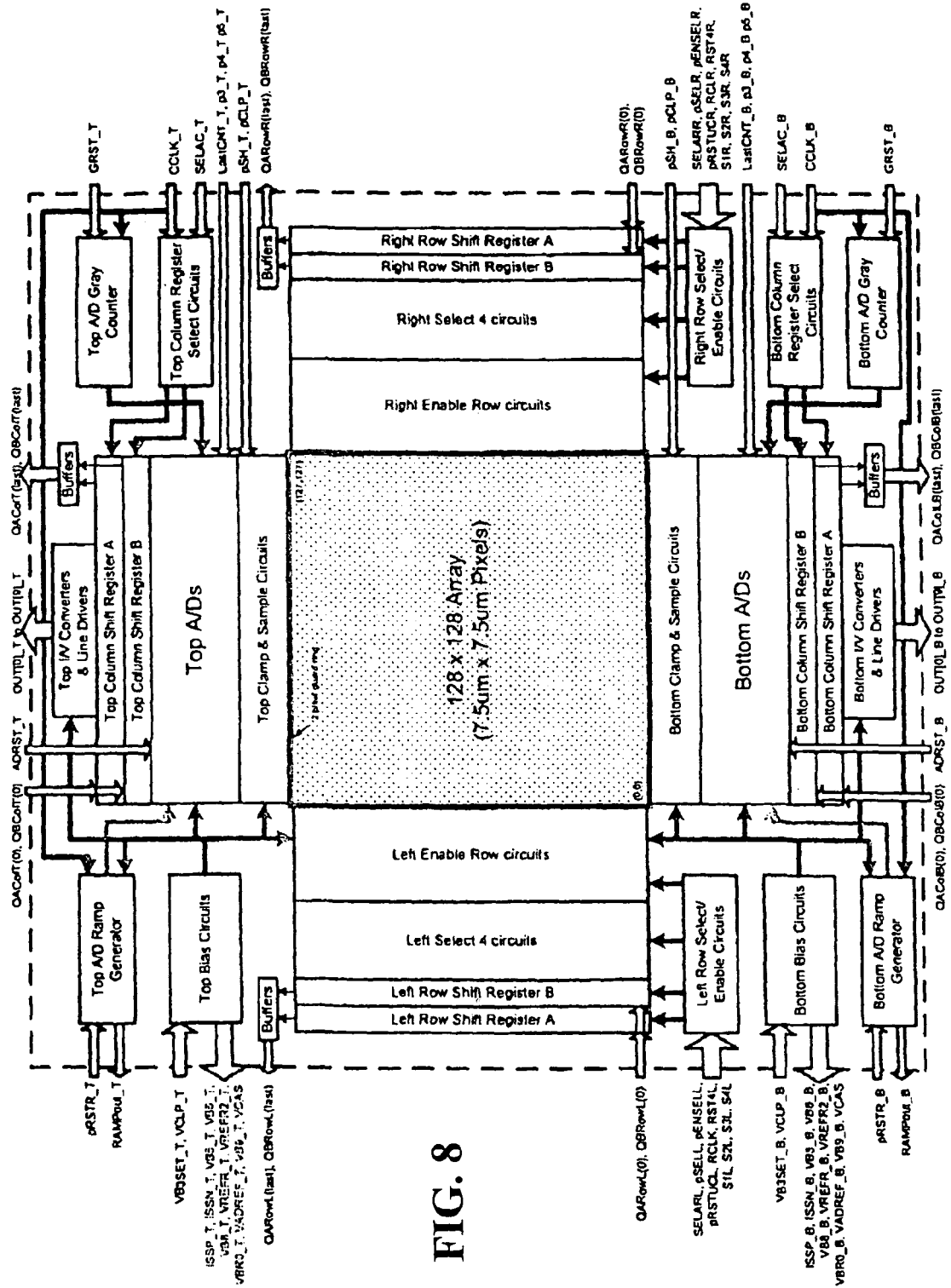
FIG. 8 shows many of the features of a 1 million pixel design adapted and used repeatedly to produce the 36 million pixel sensor.

The circuit architecture of the 36 million pixel sensor (actually 37,748,736 pixels) is similar to the basic circuit architecture of a generic 1 million pixel CMOS sensor, actually comprised of 1024×1024 (or 1,048,576) pixels. The basic idea was to stitch together lithographically 36 of these 1024×1024 pixel sensors. The electronics of the 36 million pixel sensor is basically the same as that of the 1 million pixel sensor. The overall details of the 36 million pixel sensor are shown in FIG. 8. Applicants will describe below the electronic for the 1 million pixel sensor and then discuss the modifications that were made to adapt those electronics to the 36 million pixel sensor.

One Million Pixel Array

Electronics

Each pixel in the million pixel array independently collects (i.e. integrates) electric charge and provides a voltage that is proportional to the integrated charge. Sensor circuitry provides simultaneous analog-to-digital conversion of an entire row of pixel voltages. The A to D process occurs at circuitry located at the bottom of the array. Each pixel column has its own identical A to D circuitry. Resulting 10-bit digital values corresponding to 1024 pixels in a single pixel row are simultaneously stored in 1024 10-bit digital latches located in the A to D circuitry. A 10-bit digital shift register then sequentially directs the 1024 10-bit digital values to a single 10-bit digital output located at the bottom edge of the sensor. The sensor includes a rolling readout feature. The sensor provides sequential A to D processing of every pixel row n=1, ..., 1024 in the pixel array in each 33 millisecond frame time, starting at pixel row 1, located on the bottom of the pixel array and processing sequentially to pixel row 1024, located on the top of the array. The sequential selection of each pixel row is controlled by a first pixel row select shift register, located on the right side of the array; this shift register consists of 1024 flip-flops that control the select switches of 1024 pixel rows. A single flip-flop simultaneously controls 1024 select switches (one of which is shown at 26 in FIG. 8) of a single pixel row. When the flip-flop output is high, the select switches of the pixel row are closed and connect the pixels in the row to the A to D circuitry located at the bottom of the array. A digital high signal is input to the first flip-flop of the pixel row select shift register and this high signal is sequentially clocked through the flip-flops of each pixel row at a pixel row rate. The sequential readout selection of the pixels in the entire sensor constitutes a frame. After a small amount of frame dead time, the entire pixel row readout process begins again, starting at pixel row 1 and proceeding to pixel row 1024. The pixels collect (or integrate) charge generated from incident light during a controlled time period. The integration time is controlled by a second pixel row reset shift register, located on the left side of the array; this shift register consists of 1024 flip-flops that control the reset switches of 1024 pixel rows. A single flip-flop simultaneously controls 1024 reset switches of a single pixel row. (One such switch is shown at 20 in FIG. 1D.) When the flip-flop output is high, the reset switches of the pixel row are closed and the pixel voltages are reset to approximately zero (ground). A digital high signal is input to the first flip-flop of the pixel row select shift register and this high signal is sequentially clocked through the flip-flops of each pixel row at a pixel row rate. A second digital high signal is input to the first flip-flop after a time $T_{int}$ ($0 < T_{int} <$ frame time) that is adjustable as an electronic shutter. The second reset command is synchronized with the first pixel select row shift register in order to provide the sample and clamp process. Following is a detailed explanation of the integration and readout of a signal from pixel nm (i.e. the pixel in row m and column n).

Pixel Circuitry of the 36 Million Pixel Sensor

All of the pixels of the 36 million pixel sensor are positioned below a continuous photodiode layer that collects incident light photons and converts these photons to electric charge. The pixel photodiode is reverse-biased by a photodiode bias voltage (typically around 3 to 5 volts). This bias voltage allows only a very small amount of leakage current (about 0.1 nA/cm$^2$, for example) to flow through the photodiode when there is no light incident on the photodiode. When light is incident on the photodiode, charges are generated in the photodiode layer above the pixels. These charges are collected on the pixel electrodes during the integration period.

Applicants' preferred pixel circuitry is shown in FIG. 9. Each pixel circuit is fabricated on a silicon substrate using standard CMOS techniques. Charge is collected from the overlaying photodiode layer 39 comprised of:
 A) a top 640 angstrom transparent indium tin oxide conductor layer 40,
 B) a 45 angstrom n-doped amorphous silicon layer 42,
 C) a 0.5 micron intrinsic amorphous silicon layer 44, and
 D) a bottom 100 angstrom p-doped amorphous silicon layer 46.

The p-doped bottom layer 46 is also doped with carbon as described below to increase the electrical resistance of the layer to minimize crosstalk. A pixel charge is collected by metal electrode 48 and the collected charge sits temporally on conductor node 16 between reset transistor 20 and the base 18 of source follower transistor amplifier 24. Source follower 24 provides an output voltage that is proportional to the charge collected at pixel node 16 and imposed at base 18. In this embodiment transparent layer 40 is held at about 5 volts as shown at 48 and the pixel electrode is reset at about 1.0 volt as indicated at 50.

Integration

Prior to the beginning of each integration period of the pixels in a particular row such as a row "n" (as a result of steps taken during the previous readout of pixels from the previous row "n−2"), node 16 has been set through reset transistor 20 to about 1.0 volt from 1.0 volt source 50. Node 16, which includes electrode 48 and the connecting conductors shown at 16, functions as a pixel capacitor collecting and storing charge during the pixel integration periods.

During the integration periods photons illuminating and absorbed in intrinsic layer 44 of photodiode layer 39 produce conduction electrons which are attracted to transparent conduction layer 40. This loss of electrons leaves positively charged atoms (holes) in the intrinsic layer which attract electrons from other atoms in layer 44 and ultimately from electrode 48. This is equivalent to positive holes in effect migrating from layer 44 to electrode 48 to increase the positive electric potential of node 16 above the 1.0 volt reset potential. Typical integration periods are about 0.12 second but the periods are automatically adjusted depending on the illumination levels so that during the integration period, the electric potential on node 16 increases to as high as about 2.5 volts (corresponding to maximum illumination). The potential on node 16 controls gate 18 of source follower transistor 24 which determines the electric potential at node 17. Due to the nature of this source follower transistor 24, the potential at node 17 is approximately equal to the potential at node 16 minus the threshold voltage of transistor 24 which is about 0.7 volts. As the positive electric potential at node 16 and gate 18 of transistor 24 increases as the result of electrons flowing out of node 16, additional electrons are able to flow through transistor 24 to positive bias source 25 which increases the positive potential at node 17, "following" (by the 0.7 volt threshold) the positive increase at node 16. So, at the end of the integration period, the potential at node 17 will typically be in the range of a little more than 0.3 volts to about 1.8 volts depending on the illumination received by the pixel. This potential at node 17 (that Applicants refer to as the pixel potential Vp) represents the combined reset potential, Vr, plus the illumination potential, Vi. Applicants have designed these circuits to electrically isolate and monitor Vi, the portion of Vp representing only the illumination received by the pixel.

Pixel Readout

Sample and Clamp

Each pixel in the sensor has a row select switch 26 and each column has its own readout (sample and clamp) and A-to-D conversion circuitry at the bottom and top of the sensor array as shown in FIG. 8. All of the row select switches in all of the pixels in each row are closed in a single operation so that all of the pixels in the row are read out and converted to digital simultaneously. In the 36 million pixel sensor, this is accomplished with readout circuitry at the top and bottom of each column, where the even rows are read out through the top circuitry, and the odd rows are read out through the bottom circuitry.

Consider the readout of pixel n,m in row n and column m. The readout of pixel n,m begins with the closing of row select switch 26 ending the integration period of pixel n,m. The readout circuits at the bottom of column m were prepared for the readout of pixel n,m at the end of the readout cycle for the previous column m pixel (namely pixel n−2,m). (The previous pixel, in terms of timing is n−2, not n−1 because the bottom readout circuits read every other row as explained above.) Switch 26 in pixel n−2 had been closed to readout the pixel n−2 signal. At the end of the signal readout period for pixel n−2, reset switch 20 in pixel n−2 was closed and at the same time switch 72 at the bottom of column m was closed.

Activation of reset switch 20 in pixel n−2,m forced the pixel node 16 in pixel n−2,m to reset voltage 50 Vr which is nominally 1.15 volts. This reset also forced nodes 17 and 57 to a potential Vcr equal to the potential at node 16 minus the threshold potential Vth of load follower transistor 24 that is nominally 0.7 volts (i.e. Vcr=Vr−Vth). This potential Vcr=1.15 volts−0.7 volts=0.45 volts is now at the top of capacitor 60. Activation of switch 70 forces node 61 (the bottom of capacitor 60) to the voltage Vclp, shown at 72, which is nominally 0.5 volts. The capacitor is now charged to a voltage of Vc=Vclp−Vcr=Vclp−(Vr−Vth)=0.5 volts−0.45 volts=0.05 volts. The next step in the readout of the row n pixels is to open switches 20 and 26 in row n−2, open switch 72, and close switch 26 in row n (including the n,m pixel shown in FIG. 9) in order to sample the integration potential Vi at pixel n,m. Prior to closing switch 26 node 16 is at a potential of Vi+Vr and node 17 is at a potential Vci=Vi+Vr−Vth. Closing switch 26 in pixel n,m forces node 57 to the same potential of Vci=Vi+Vr−Vth.

The potential at node 61 (called the signal voltage Vs) becomes to the sum of the potential at node 57 (namely Vci=[Vi+(Vr−Vth)$_n$,] plus the potential stored on capacitor at the end of the n−2 readout cycle (namely Vc=[Vclp−(Vr−Vth)$_{n-2}$]). Therefore, the potential Vs at node 61 is:

$$Vs = Vci + Vc = [Vi + (Vr-Vth)_n] + [Vclp - (Vr-Vth)_{n-2}]$$

Applicants have determined that there is no significant difference between the difference quantities (Vr−Vth) for pixel n and the same difference quantity for adjacent pixel n−2.

Therefore:

$$Vs = Vi + Vclp.$$

With switch 62 activated the potential at node 66 becomes Vs+Vth$_1$ and the potential at node 76 Vo becomes Vo=Vs+Vth$_1$+Vth$_2$, where Vth$_1$+Vth$_2$ refer to the threshold voltages of load follower transistors 65 and 65. So the output potential at node 76 is:

$$Vo = Vi + Vclp + Vth_1 + Vth_2.$$

Vclp, Vth$_1$ and Vth$_2$ are all constant voltages that can be thought of as Vcon so:

$$Vo = Vi + Vcon.$$

The analog signal Vo is then converted into a digital signal in A to D conversion circuitry also located at the bottom or top of each column of the sensor adjacent to the readout circuitry described above. The Vcon portion of Vo is eliminated in the course of the A to D conversion process as explained in the following section.

Modified Double Sampling

The reader should note that the sampling technique described above is a modified form or double sampling. Strict double sampling would require a sample to be taken of the reset signal potential and a later sample taken of the pixel signal followed by a subtraction of the reset signal from the pixel signal. In the technique described above, a reset signal for a corresponding pixel "n−2,m" in the previously sampled row is saved on capacitor unit 60 and that signal is electrically subtracted from the signal potential from pixel "n,m" sampled after integration of pixel "n,m". The reader should understand that if there were a significant difference between the reset signals from pixel "n−2,m" and pixel "n,m", use of this technique could result in significant errors. However, Applicants have determined that pixel reset values are very constant and that any errors introduced by the use of this sampling technique are typically totally insignificant. This is especially true if multiple images are combined or if the sensor is operated in video mode. On the other hand use of this technique substantially simplifies the design and fabrication of the sensor. Simplification in embodiments of this invention is very valuable since 36 million pixels in one chip would ordinarily lead to very poor product yields at the fabrication plant.

A to D Circuitry

Each pixel column has identical A to D circuitry at the bottom and top of the pixel array. As with the readout circuitry, even rows are converted at the top and odd rows are converted at the bottom. The A to D circuitry located at the top and bottom of the pixel array then simultaneously processes the 1024×6 (i.e. 6,144) separate voltages from a single row of 6144 pixels.

Figure 10:
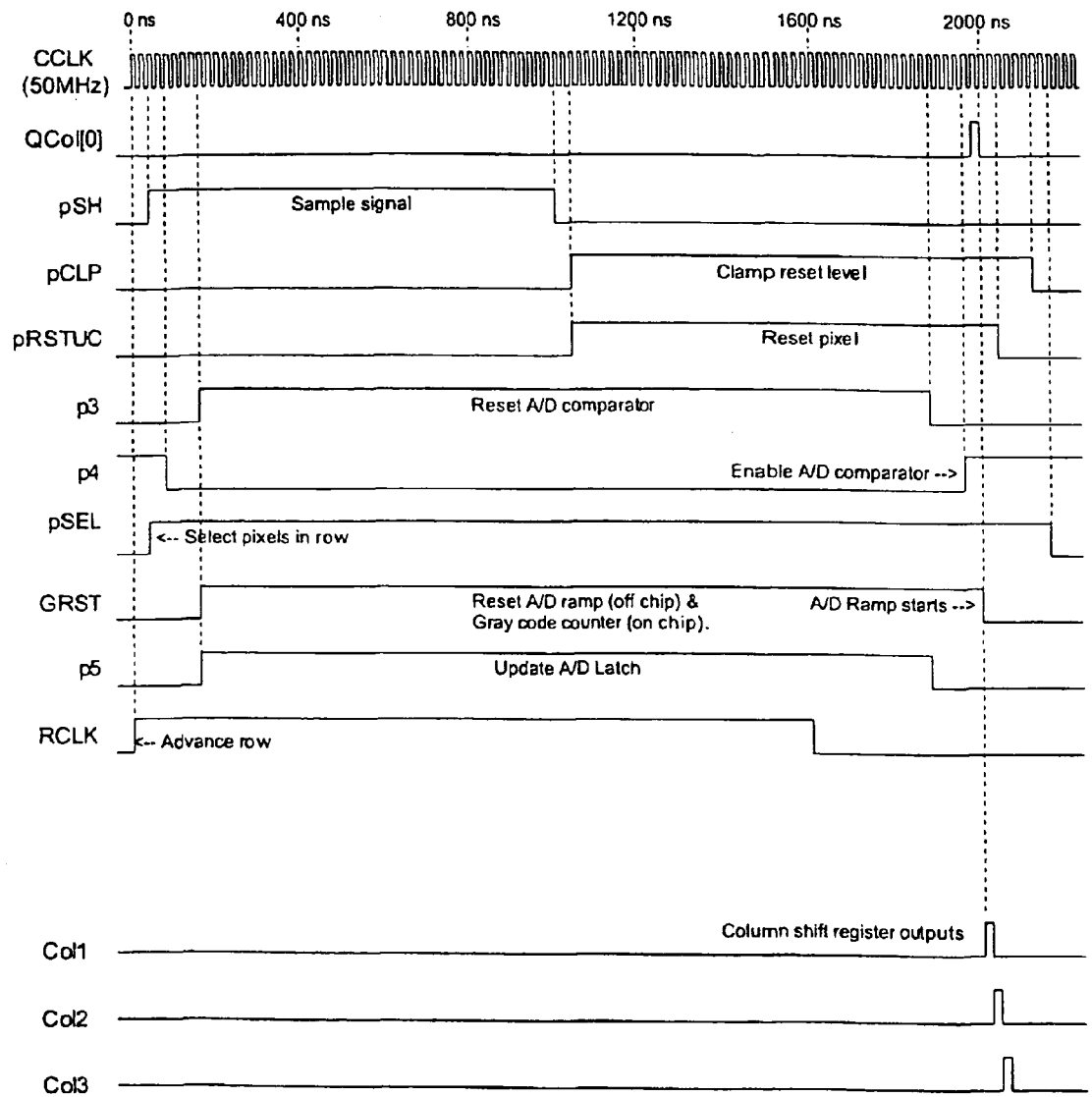
FIG. 10 shows timing features for collecting and reading out pixel signals.

FIG. 10 displays timing signals for the pixel selection and reset and the A to D circuitry. The following is a explanation of how the signals from a row n (especially the m,n pixel) is readout and digitized. The pixel select switches 26 of all pixels in row n are closed simultaneously as explained above for readout purposes.

Figure 11:
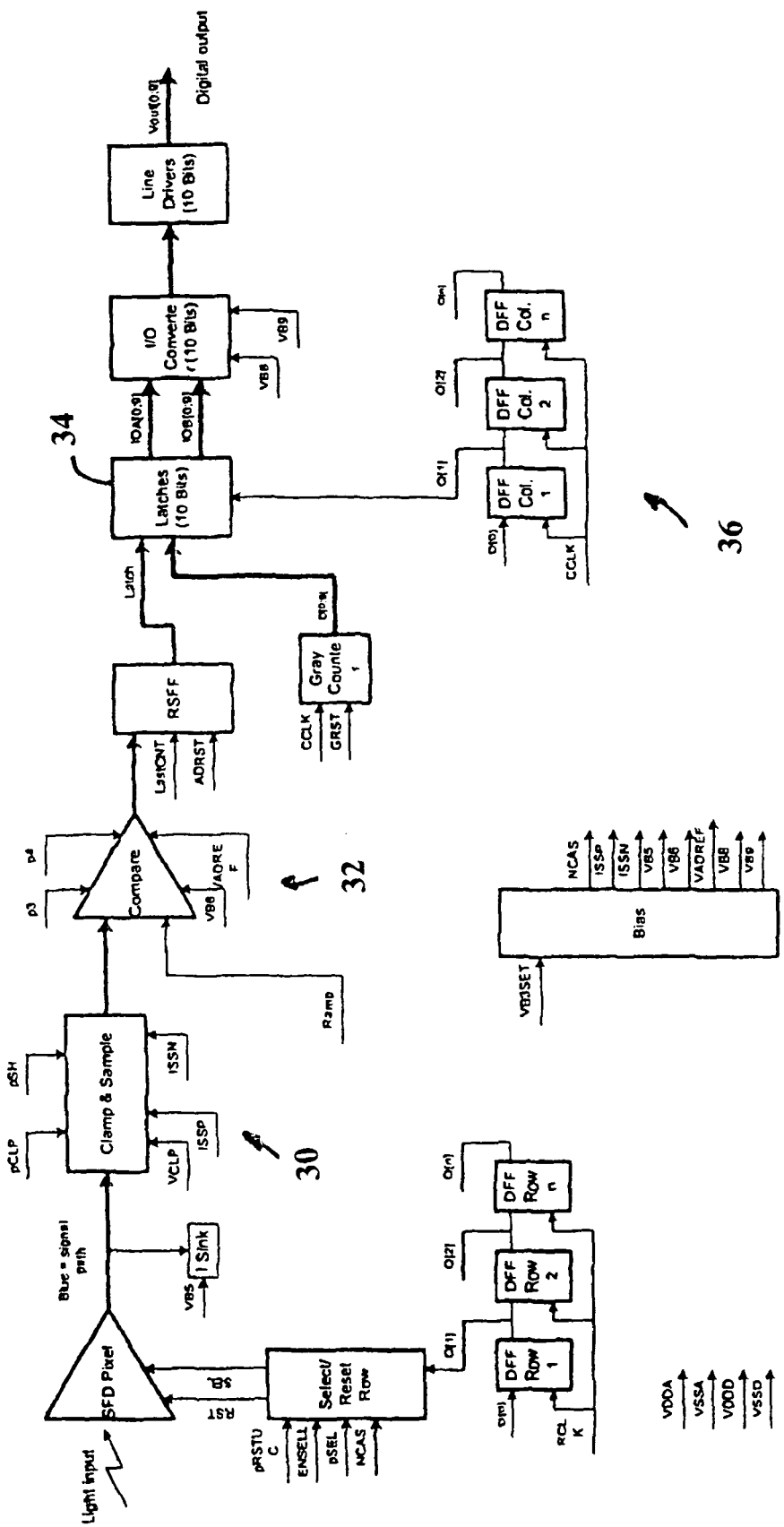
FIG. 11 is an electrical diagram showing how pixels signals are collected and read out.

1) Column amplification: Circuit 59 at the bottom of the pixel array provides further amplification of the output voltage of pixel (n,m) amplifier 24.
2) Sampling and Conversion to Digital: As explained above each column is provided with an analog-to-digital converter circuit. Sampling and conversions of the pixel analog signals for each pixel in a row take place simultaneously in the analog to digital converter circuits with timing as described below:
   a) Sampling circuit: At t=0 nsec the pixel row n select switches 26 for all pixels in row n are closed connecting the output of pixel (n,m) amplifier to the column m A to D circuitry. At t=20 nsec (in a clamp and sample circuit 30 as shown in FIG. 11) at the bottom of the array, a column m sample switch 62 is closed and the column m clamp switch is left open, and the column m clamp and sample circuit 30 acquires the pixel voltage Vo=Vi+Vcon as explained above. A small amount of time (about 500 nsec) is required for the sample and clamp circuit to fully acquire the pixel voltage. At t=520 nsec, the column m clamp switch 62 is closed and the column m sample switch is simultaneously opened. Immediately after this switching action (t=540 nsec), the pixel (n,m) reset switch 20 is closed. At t=1040 nsec, clamp and sample circuit has acquired a voltage Vcr=Vclp−(Vr−Vth) that is stored on capacitor unit 60 for pixel n+2.
   b) Analog-to-digital conversion: Each circuit includes a slope converter that consists of a comparator and a 10-bit Gray counter 31. The output Vo=Vi+Vcon of the column m clamp and sample circuit 30 connects to the positive input of the column m comparator 32. An external ramp generator provides an analog ramp voltage $V_{ramp}$ that ramps to a voltage corresponding to a 10-bit Grey counter count (i.e. 1024) at maximum expected illumination but includes a DC offset chosen to produce counts between about 100 and 200 from each of the pixels when the sensor is covered (i.e. with zero illumination). The ramp generator output voltage connects to the negative input of the comparator 32 as shown in FIG. 11. At t=1060 nsec, the column m 10-bit Gray i counter begins to count up from 0 to 1023. The column m comparator provides a digital low (0) output value when Vo>$V_{ramp}$, and a digital high (1) value when Vo<$V_{ramp}$. When the ramp voltage Vo=$V_{ramp}$, the output of the column m comparator immediately (i.e. less than 10 ns) transitions from 0 to 1; this digital high signal causes the column m counter to stop. The final uncorrected count Niu for each pixel is a 10-bit digital value that is proportional to the analog voltage Vi for the pixel plus a constant number Ki (between about 100 and 200), i.e. Niu=NVi+Ki This count is stored in a column m 10-bit latch 34 as shown in FIG. 11.

3) Digital shift register: At t=2084 nsec, the 1024 column latches now contain 1024 10-bit digital values corresponding to the 1024 pixel voltages of pixel row n. At t=2084, a digital shift register consisting of 1024 flip-flops then sequentially shifts the 1024 digital values to a 10-bit parallel output. Circuitry external to the sensor then routs these 1024 digital values serially to a computer memory as indicated at 36 in FIG. 11.

4) Rolling Integration Circuitry:

The sensor can immediately proceed to the next row and begin the A to D processing of it; this process is started by opening the pixel row n select switches and by closing the pixel row n+2 select switches. This sequential readout of 1024 digital values requires exactly the same time as the A to D processing. In other words, the settling times of the clamp and sample circuits are set so that the two processes (i.e. A to D processing of pixel row n+2 and digital serial readout of pixel row n to the computer memory) occur at exactly the same time. This keeps the entire pixel readout process in constant synchronization.

5) Dark Frame Correction

To get rid of the constant Ki created in step 2b, a "dark frame" is created from time to time to determine the pixel count for each pixel (mostly between 100 and 200 counts) with the sensor covered (zero illumination). This dark frame data (approximately equal to Ki) is stored in the sensor processor memory. The sensor processor subtracts the dark frame values from Niu for each pixel i to yield the illumination signal Ni=NVi+Ki−Ki×NVi for each pixel.

Thirty Six Million Pixel Specifications, Clocking Times and Spacings

Figure 14:
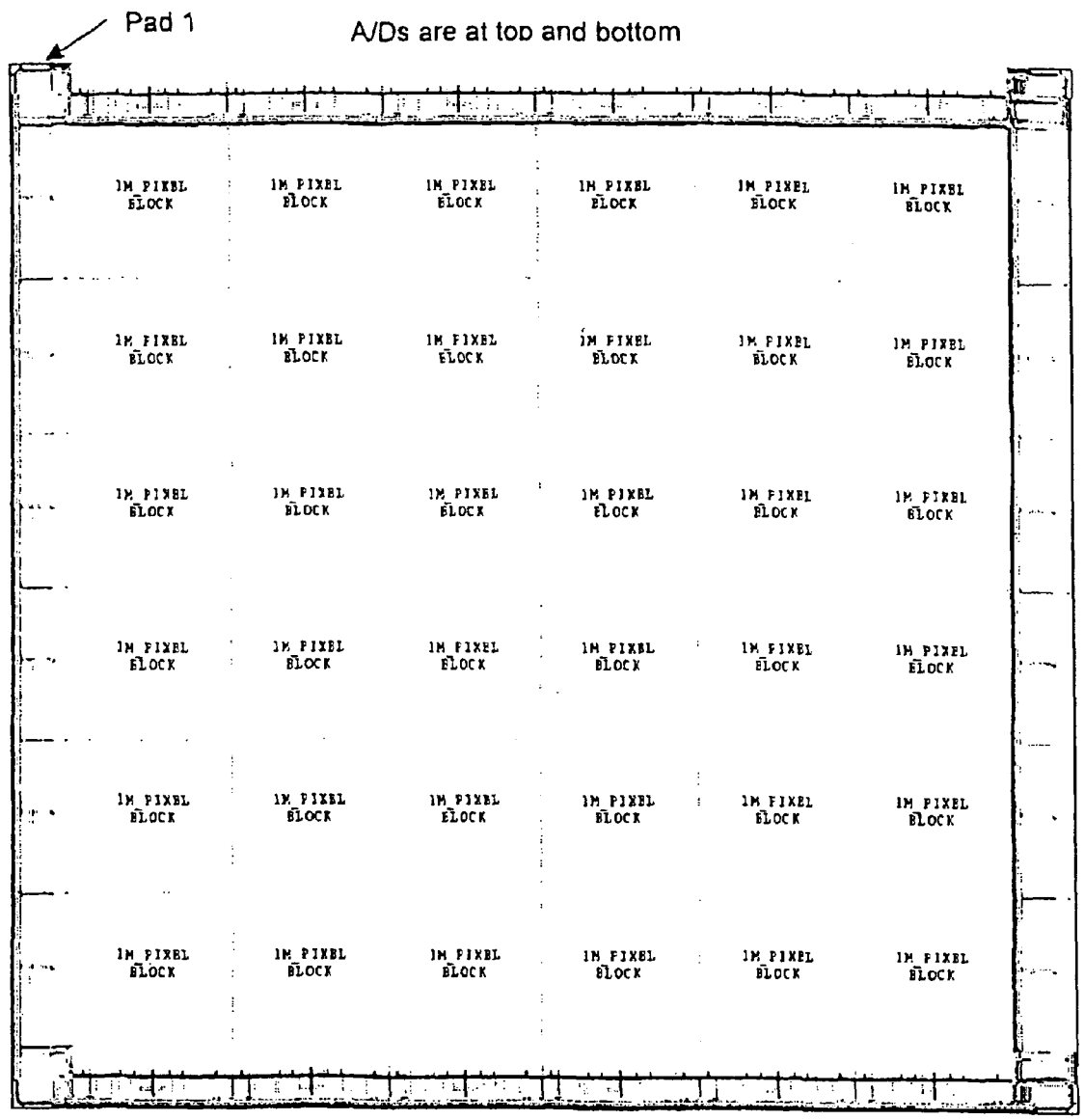
FIG. 14 shows the floor plan for the 36 million pixel sensor.

The top level specifications for the 36 million pixel sensor are displayed in FIG. 12. The clocking times for this sensor are displayed in FIG. 13. The spacings of the thirty six 1 million pixel arrays are shown in FIG. 14. Applicants initially used a 10 MHz master clock for the sensor operations. However, the sensor is designed to operate with a nominal 50 MHz clock.

Overview of Circuit Architecture

The sensor is designed and fabricated using a specialized CMOS stitching technique previously developed for fabrication of large integrated circuits. FIG. 14 displays the circuit floor plan for the sensor. The 36 million pixel array is fabricated as 36 identical 1024×1024 pixel (about 1 million pixels) blocks that are arranged in a 6 block×6 block array, so that the final pixel array is 6144×6144 pixels (about 36 million pixel). The sensor works in a very similar manner as the basic 1 million pixel sensor that was described above. The pixel circuit is the identical. The A to D circuitry is identical. The major differences are:

1) The 36 million pixel sensor reads out (or digitizes) two adjacent pixel rows simultaneously. Consider the readout of the pair of pixel rows n and n+1. The bottom pixel row n is read out by the bottom A to D circuitry and the top pixel row n+1 is read out by the top A to D circuitry.
2) The 36 million pixel sensor pixel row select shift register located on the right side of the array, has 3072 flip-flops. This shift register consists of six circuit sections; each section contains 512 flip-flops. This shift register sequentially connects the pixel row pairs to the A to D circuitry located on the bottom and the top of the array. The first flip-flop is located at the bottom of the array and the last flip-flop is located at the top of the array.
3) The 36 million pixel sensor pixel row reset shift register, located on the left side of the array, has 3072 flip-flops. This shift register consists of six circuit sections; each section contains 512 flip-flops. This shift register sequentially closes the resets switches of the pixel capacitors of the pixel row pairs, and resets the pixel voltages to zero volts (ground). The first flip-flop is located at the bottom of the array and the last flip-flop is located at the top of the array.
4) The 36 million pixel sensor has identical A to D circuitry as the basic 1 million pixel sensor, with these differences. The bottom A to D circuitry of the 36 million pixel sensor simultaneously digitizes 3072 columns of a pixel row n (even columns, 0, 2, 4, . . . , 3070). The top ADC circuitry simultaneously digitizes 3072 columns of a pixel row n+1 (odd columns, 1, 3, 5, . . . , 3071). The 36 million pixel sensor has twelve independent shift registers, that simultaneously shifts 1024 10-bit digital data from 1024 ADC column outputs.

Auxiliary Components

Figure 15:
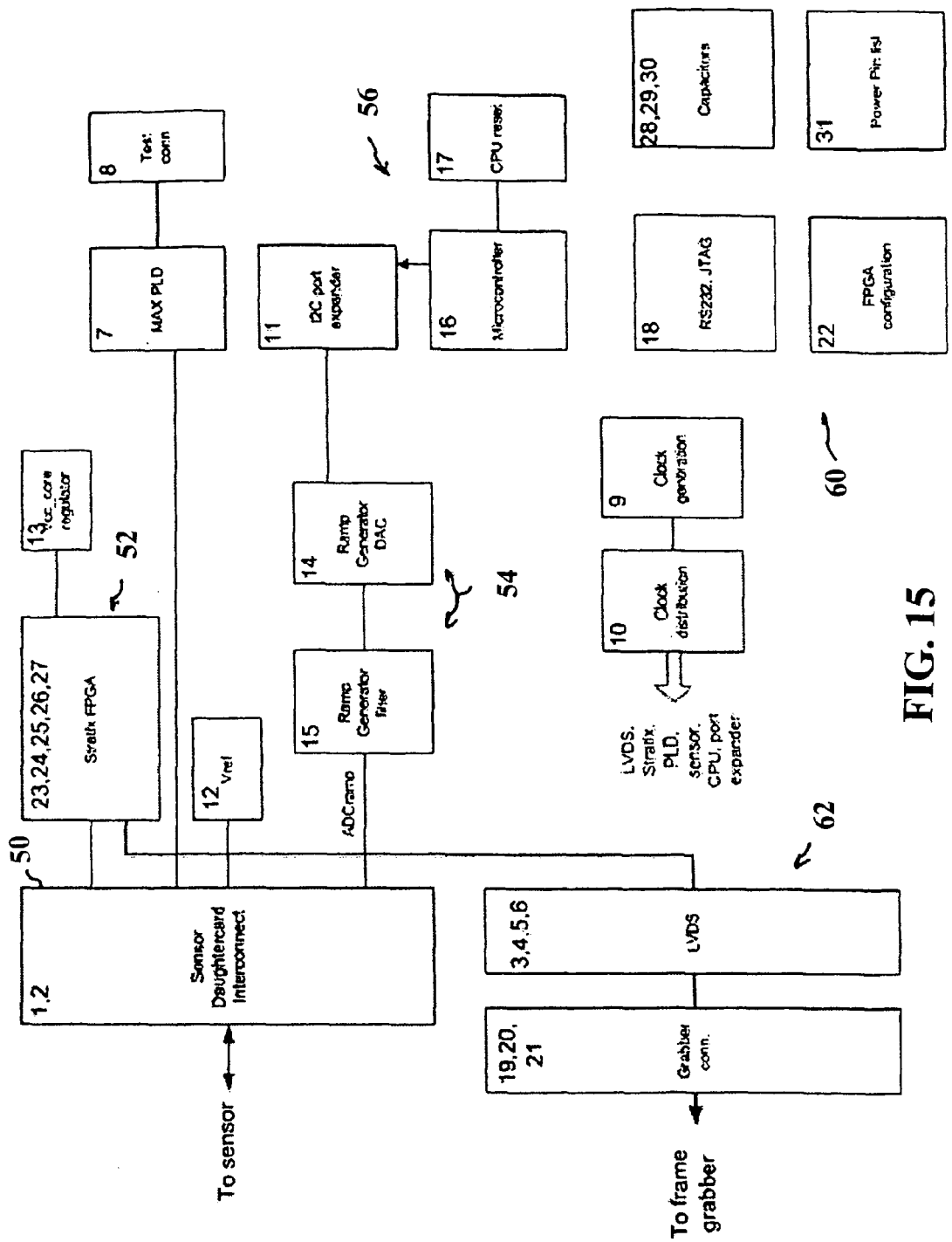
FIG. 15 shows some auxiliary components needed for some applications of the 36 million pixel sensor.

The 36 million pixel sensor described above may be utilized in a wide variety of applications. In all such applications auxiliary components will be required. FIG. 15 shows a typical set of auxiliary components. These include: a sensor daughterboard inter connect 50; data output multiplexing circuits 52; ramp generator circuits and filter 54; a central processing unit, microcontroller and 12C communication protocol components 56; clocking circuits 58; setup programming components 60; low voltage digital signaling components for providing signal data to a frame grabber. The frame grabber is not shown.

Preferred Photodiode Layers

As explained above a very important feature of the present invention is the continuous multilayer photodiode layer that is deposited on top of the many million pixel array. Several designs for these layers are described in detail in the parent patent applications referred to in the first paragraph of this specification. These layers contain a conducting top layer (such as transparent indium tin oxide, ITO) and an intrinsic layer (such as intrinsic amorphous silicon) sandwiched between a p-layer (such as p-doped amorphous silicon) and an n-layer (such as n-doped amorphous silicon). In some designs the p-layer is on top just below the conducting layer and the n-layer is on the bottom below the intrinsic layer and in contact with the pixel electrodes. In other designs the polarity is reversed and the n-layer is on top and the p-layer is on the bottom in contact with the pixel electrodes.

Figure 16:
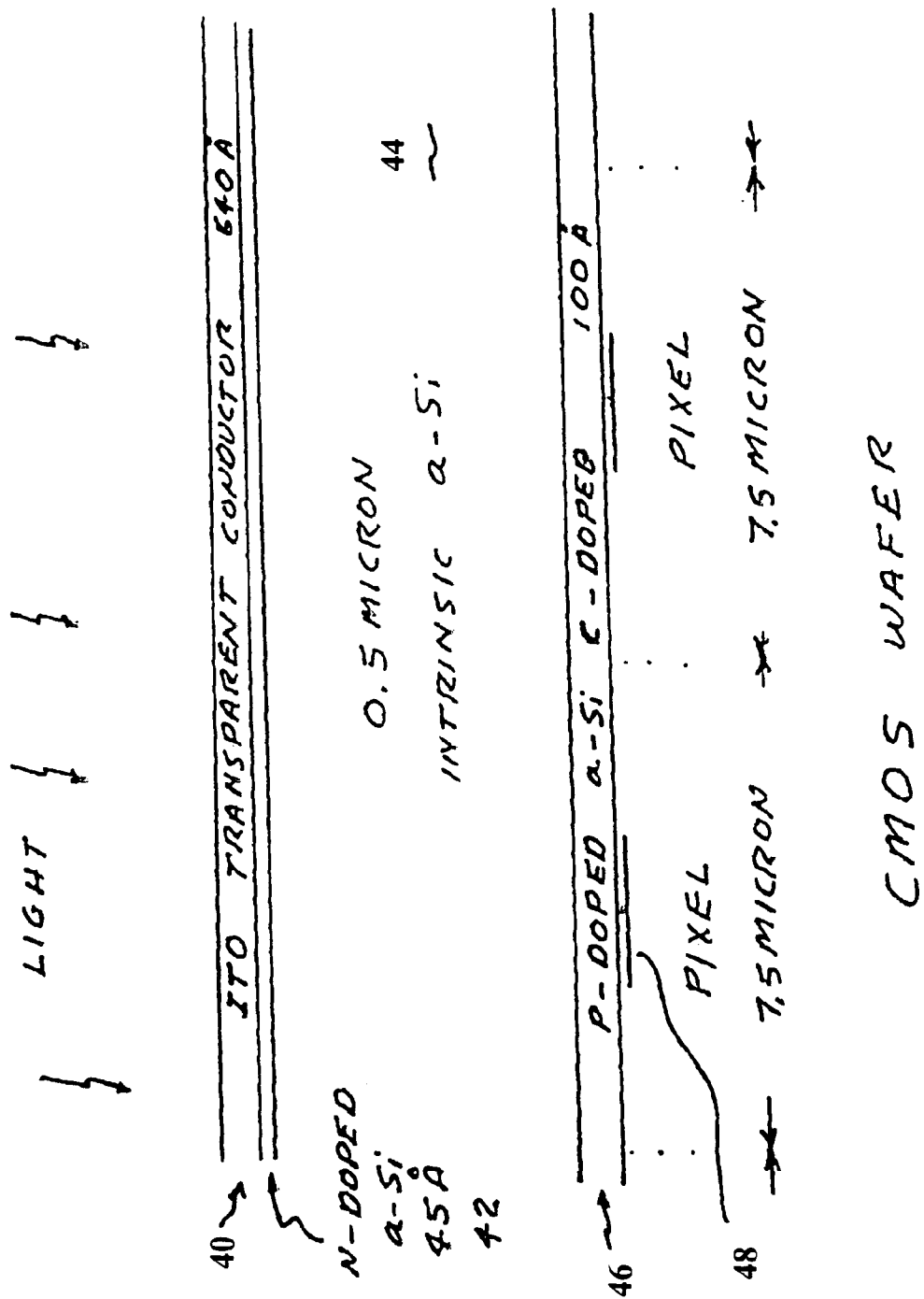
FIG. 16 shows features of the design of the continuous photodiode layer of the 36 million pixel sensor.

FIG. 16 shows details of the photodiode layer used on the 36 million pixel sensor designed and built by Applicants. It includes a 640 angstrom thick indium tin oxide transparent conducting layer 40, a 45 angstrom thick n-doped amorphous silicon layer 42, a 5 micron thick intrinsic amorphous silicon layer 44 and a 100 angstrom thick p-doped amorphous silicon layer 46. The p-doped bottom layer is also doped with carbon to increase its electrical resistance to minimize crosstalk between adjacent pixels. In this preferred embodiment the pixel electrodes 48 are about 5.5 microns×6 microns representing about 59 percent of the cross sectional area of the 7.5 micron×7.5 micron pixel and are lithographically created with a layer of indium tin oxide.

Crystalline and Microcrystalline Germanium and Silicon Germanium

The near infrared (NIR) performance of microcrystalline silicon photodiode sensors can further be enhanced by alloying with germanium. Crystalline germanium has an indirect band gap of 0.67eV that corresponds to a wavelength of about 1.8 microns. For a high degree of crystallinity, the bandgap of a μc-SiGe alloy would then vary from 1.1eV to 0.67eV as the germanium content is increased from 0% to 100%. Furthermore, the optical absorption coefficient of germanium is nearly an order of magnitude higher than silicon, thus a μc-SiGe alloy with a high germanium content would be significantly more absorbing in the NIR regime than μc-Si alone.

Silicon and germanium are miscible and have very similar lattice constants. They also both appear in the same column of the periodic table and so electrically behave very similarly. A μc-SiGe alloy can then be fabricated with anywhere from 0% to 100% germanium. FIG. 10A shows the increasing NIR response with increasing germanium content. This increase in response occurs for two distinct and important reasons. First, as the germanium content of the alloy increases, the effective band gap of the resulting alloy shifts from 1.1eV at 0% to 0.7eV at 100%. Second, germanium has a nearly direct band gap, which results in a significantly higher absorption coefficient as compared to μc-Si. Thus as the germanium content increases, so does the effective absorption coefficient. Extending this approach to its logical conclusion, the use of a purely μc-Ge photodiode structure should then maximize both absorption and wavelength range.

Nearly all published work on silicon-germanium based devices comes from thin film photovoltaic research. This community is primarily interested in increasing the net efficiency of thin film solar cells. Alloying of silicon and germanium is performed primarily for optimization of the bottom cell in tandem, multi-junction, solar cell devices where there is little need to have a band gap below 1.0eV. Therefore there is very little existing data regarding purely μc-Ge photodiodes and material properties. The limited data that is available for the absorption of μc-Ge in the NIR shows that it is higher than that of c-Ge. This behavior is similar to the enhanced absorption of μc-Si as compared to c-Si. Optical data is required over the entire range from UV to NIR for the modeling of the QE performance of a μc-Ge photodiode. Since data is only available for a portion of this range, Applicants have used the optical properties of crystalline germanium (c-Ge) in their models. Since the NIR absorption of μc-Ge is higher than c-Ge, the predicted performance by our model then represents a lower limit to the NIR QE performance of an actual μc-Ge photodiode. Actual QE performance to 1.8 microns can be significantly higher than what is predicted by this model.

The $SiO_2$ antireflective coating and the indium tin oxide top electrode were simultaneously optimized to maximize response in the 250 nm to 300 nm range. A 25 Å μc-Ge top doped layer was assumed for parasitic absorption calculation. The design provides significant response from 250 nm to 1600 nm with IR response increasing with increasing absorber layer thickness. A maximum practical thickness of ~3 microns is reasonable to expect. Of note is that this structure is predicted to have near 50% QE over the range of 250 nm to 300 nm, greater than 70% QE at 1060 nm and about 30% QE at 1500 nm, assuming a 3 micron layer. The IR performance for actual μc-Ge could be even higher, with very significant response extending all the way to 1800 nm.

Germanium Deposition Methods

First Preferred Method

Microcrystalline germanium (μc-Ge) can be deposited onto a substrate via continuous wave, rf plasma enhanced chemical vapor deposition (PECVD). This deposition technique consists of a high vacuum or an ultra high vacuum chamber equipped with capacitively coupled, parallel plate electrodes spaced 1 to 5 cm apart. The substrate is mounted to either the grounded or the powered electrode, with the grounded electrode configuration more typical. The substrate temperature is maintained in the range of 100 to 300 C. A standard 13.56 MHz rf generator and matching network supply the power for generation of the plasma. For an extrinsically undoped germanium film, $GeH_4$ and $H_2$ feedstock gasses are mixed in the range of 10:1 to 100:1 $H_2$ to $GeH_4$, regulated by means of mass flow controllers. The gases are introduced to the vacuum chamber at a fixed total flow rate and the total chamber pressure is regulated in the range of 0.1 to 10 Torr. A conventional continuous wave, rf plasma is activated between the electrodes to initiate dissociation of the feedstock gasses into reactive species. Once the gasses are broken down, the resulting radicals react at all exposed surfaces, resulting in film growth. For a given total pressure and gas mixture, the growth rate is controlled by regulation of the total plasma power, which can cover the range of 5 to 500 mW per square centimeter of electrode area. Increasing the plasma power increases the deposition rate. The maximum deposition rate is limited by the polymerization of reactive species in the gas phase, resulting in the formation of particulates, or dust. Doping of the μc-Ge film is accomplished by the addition of diborane ($B_2H_6$) or phosphene ($PH_3$) to the feedstock gasses for p-type or n-type doping, respectively.

Second Preferred Method

Microcrystalline germanium may also be deposited onto a substrate via pulse modulated, RF PECVD. The technique is basically the same as that described above except the rf output is modulated by a square wave with a frequency in the range of 10 to 100 KHz and a duty cycle of 10 to 50%. For a given total pressure and gas mixture, the growth rate is controlled by regulation of the total plasma power, which can cover the range of 50 to 1000 mW per square centimeter of electrode area. Increasing the plasma power increases the deposition rate. In the continuous wave application, the maximum deposition rate is limited by the polymerization of reactive species in the gas phase, resulting in the formation of particulates, or dust. The utilization of pulsed modulation allows increased deposition rates by providing a means to remove nucleation sites for dust formation. Negatively charged ions are formed and become trapped in the plasma. These negative particles become the nucleation sites for particulate growth. Modulation of the RF power provides breaks in the plasma during which the negative ions can be swept out of the chamber with the gas flow. This suppresses powder formation and thus the limitation to higher deposition rates is removed. Doping of the μc-Ge film is accomplished by the addition of diborane ($B_2H_6$) or phosphene ($PH_3$) to the feedstock gasses for p-type or n-type doping, respectively.

The pulse modulated plasma technique has been demonstrated to be effective for the growth of both amorphous and microcrystalline silicon thin films. The typical deposition rate for continuous wave RF PECVD deposited, device quality amorphous silicon is approximately 1-2 Å/s. Use of pulse modulated plasma deposition has resulted in deposition rates of greater than 7 Å/s for device quality films[1]. Similarly, device quality microcrystalline silicon is typically deposited at a rate of less than 1 Å/s in a continuous wave plasma while use of a pulse modulated plasma can increase the deposition rate to greater than 1 Å/s, with 1.2 Å/s being reported[2]. The plasma chemistry of $GeH_4$ is similar to that of $SiH_4$, therefore similar behavior is expected. Additional details concerning these two techniques are provided in the following references: (1) S. Morrison, A. Madan; Deposition of Amorphous Silicon Solar Cells via the Pulsed Plasma PECVD Technique; 28th IEEE PVSC, Anchorage, Sep. 15-22, 2000, and (2) S. Morrison, U. Das, A. Madan; Deposition of Microcrystalline Silicon Films and Solar Cells via the Pulsed PECVD Technique; 29th IEEE PVSC, New Orleans, May 20-24, 2002.

Microcrystalline Ge Sandwich Design

Other preferred embodiments include a CMOS sensor having an amorphous silicon photodiode layer with mc-Ge (+mc-Si buffers layers) inserted within the i-layer. In these preferred embodiments interfaces between the layers of the photodiode layer are graded to improve performance. Preliminary tests show spectral non-zero responses over the range 400 nm to 1300 nm.

In tests by Applicants a reverse bias voltage was increased to overcome internal barriers and/or transport problems to allow collection of carriers generated within the mc-Ge layer. It was found that the dark current of the mc-Ge containing devices was too high ($>10^{-6}$ A) at the required bias voltages to allow traditional QE measurements, as the drift in dark current was larger than the detectable signal. This was overcome by performing a modified QE measurement at a single wavelength (800 nm). The modified measurements were performed on photodiodes with 0 Å, 100 Å, and 500 Å mc-Ge. The QE response at 800 nm was found to increase from 0.27% in the standard a-Si photodiode to 3.38% in the diode containing 500 Å mc-Ge. This response is significantly higher than could be achieved by collection in either a-Si or mc-Si at the thicknesses used. It is therefore clear that good photo response in the mc-Ge has been demonstrated.

Microcrystalline germanium has significant potential for use as the photo-detective element in these image sensors for visible to short wave infrared applications. Its bandgap can be as low as 0.67eV allowing photon collection in the range of eye-safe lasers and peaks in the night sky spectrum. Furthermore, the growth of mc-Ge can be performed at low temperature in a plasma enhanced CVD reactor, which is compatible with this technology.

Limited reports in the literature have indicated that it is possible to grow device-grade mc-Ge. The first steps in this development involved achieving a high crystalline fraction in as-deposited films, and reducing the dark conductivity to levels approaching those reported for intrinsic material ($\sim 10^{-4}$ $(W-cm)^{-1}$). The next step was to generate diodes based on mc-Ge and demonstrate diode behavior and then photoresponse. It was discovered quickly that development of an all mc-Ge diode was very difficult. As a result, the decision was made to explore the concept of embedding the mc-Ge layer within an amorphous silicon photodiode. This allowed leveraging of the years of development that have gone into amorphous silicon devices while gaining the infrared response of the mc-Ge.

Figure 17:
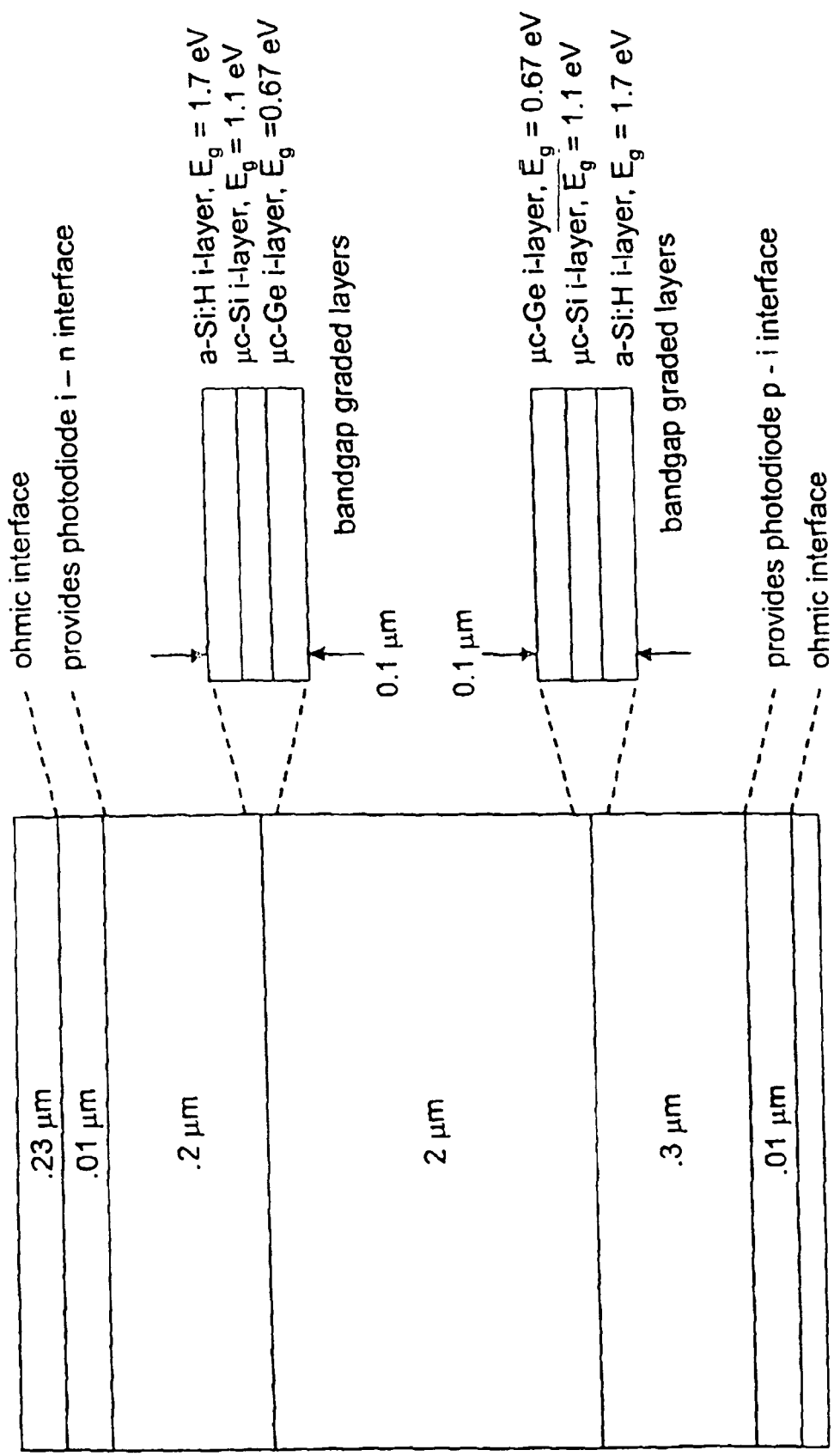
FIG. 17 shows a preferred photodiode layer design to produce sensors responsive to infrared light in addition to visible light.
Figure 18:
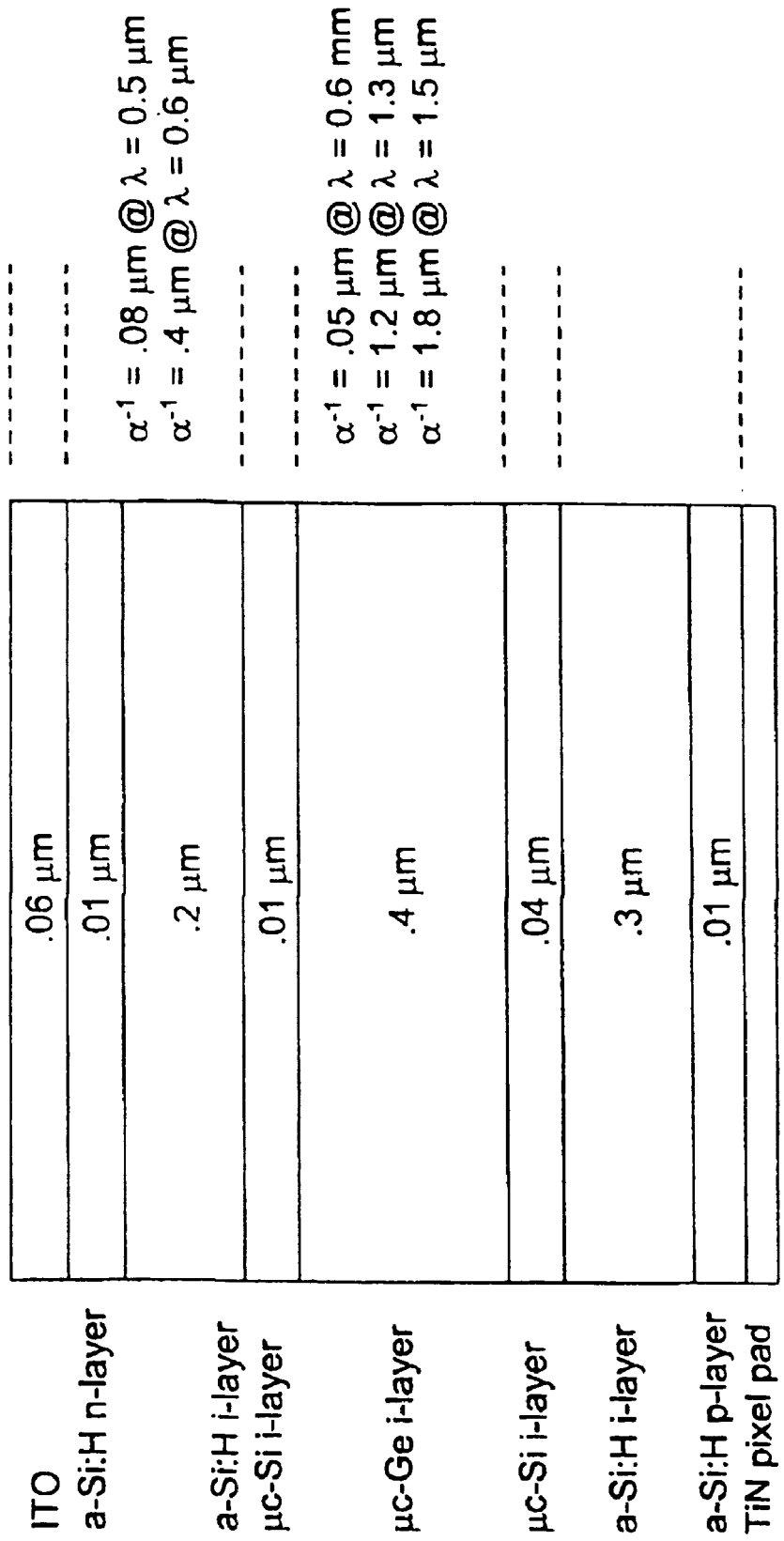
FIG. 18 shows another preferred photodiode layer design indicating absorption coefficients for visible and infrared light in amorphous silicon and micro-crystalline germanium.

FIGS. 17 and 18 show preferred micro crystalline geranium sandwich designs. In FIG. 17 a 2 micron micro crystalline geranium intrinsic layer is sandwiched between a 0.2 micron amorphous silicon layer and a 0.3 micron amorphous silicon layer with 0.1 micron layers of amorphous silicon, microcrystalline silicon and microcrystalline geranium layers forming band gap graded layers between the larger sandwich layers. The band gaps of the graded layers are shown in the drawing. FIG. 18 is another photodiode layer design that has been successfully tested by Applicants. By adjusting the thicknesses of the layers the sensor can be designed to preferentially detect light in the infrared region as compared to light in the visible region of the spectrum. This drawing shows absorption coefficients for wavelengths of 0.5 microns, 0.6 microns, 1.3 microns and 1.5 microns in amorphous silicon and microcrystalline geranium.

While there have been shown what are presently considered to be preferred embodiments of the present invention, it will be apparent to those skilled in the art that various changes and modifications can be made herein without departing from the scope and spirit of the invention. For example, the polarity of the photodiode layer could be reversed so that electrons are collected on the pixel electrodes during pixel integration. The sensor could be adapted for imaging ultraviolet light or x-rays by use of appropriate ultraviolet or x-ray absorbing material in the photodiode layer, especially the i-layer. Also, the sensor could be adapted for imaging x-ray by applying a surface layer (such as cesium iodide) adapted to absorb x-rays an produce lower energy radiation that in turn is converted into electrical charges in the continuous photodiode layer. Many CMOS circuit designs currently in use in much smaller pixel arrays could be adapted using the teachings of the present invention to produce many million pixel arrays. Other sample and hold circuits could be used such as any of many available designs that provide true double sampling. Thus, the scope of the invention is to be determined by the appended claims and their legal equivalents.

We claim:

1. A CMOS image sensor comprising:
    A) a plurality of pixel arrays lithographically stitched together on a substrate without discontinuities to provide a continuous pixel array of at least 20 million pixels, each pixel in said pixel array comprising at least three transistor circuits and a pixel electrode,
    B) a plurality of readout circuits lithographically fabricated on said substrate and adapted to permit readout of signals collected by pixels of said continuous pixel array,
    C) an entire continuous planar photodiode layer of charge generating material completely overlaps said continuous pixel array of at least 20 million pixels for converting electromagnetic radiation into electrical charges, said entire continuous planar photodiode layer defining at least an n-layer, and i-layer and a p-layer, wherein said i-layer comprises microcrystalline germanium material;
    D) a surface electrode in the form of a grid or thin transparent layer located above said continuous layer of charge generating material and
    E) a plurality of reset circuits lithographically fabricated on said substrate and adapted to reset said at least 20 million pixels of said continuous pixel array after each readout of signals and to provide electrical potentials between said pixel electrodes and said surface electrode.

2. The sensor as in claim 1 wherein said continuous pixel array of at least 20 million pixels is comprised of a plurality of identical or substantially identical pixel arrays, lithographically stitched together.

3. The sensor as in claim 1 wherein said readout circuits are comprised of a plurality of identical or substantially identical readout circuits, lithographically stitched together.

4. The sensor as in claim 1 wherein said reset circuits are comprised of a plurality of identical or substantially identical reset circuits, lithographically stitched together.

5. The sensor as in claim 1 wherein said continuous pixel array comprises is at least 36 million pixels.

6. The sensor as in claim 1 wherein said continuous pixel array comprises at least 100 million pixels.

7. The sensor as in claim 1 wherein said continuous pixel array comprises at least 250 million pixels.

8. The sensor as in claim 1 wherein said microcrystalline germanium layer and said an amorphous silicon layer are adapted to minimize changes in indexes of refraction.

9. The sensor as in claim 1 wherein said sensor also comprises a surface layer adapted to absorb x-rays and to produce lower energy radiation that in turn converted into electrical charges in said entire continuous planer photodiode layer.

\* \* \* \* \*